United States Patent
Lukas et al.

(10) Patent No.: US 7,098,149 B2
(45) Date of Patent: *Aug. 29, 2006

(54) MECHANICAL ENHANCEMENT OF DENSE AND POROUS ORGANOSILICATE MATERIALS BY UV EXPOSURE

(75) Inventors: Aaron Scott Lukas, Lansdale, PA (US); Mark Leonard O'Neill, Allentown, PA (US); Jean Louise Vincent, Bethlehem, PA (US); Raymond Nicholas Vrtis, Orefield, PA (US); Mark Daniel Bitner, Nazareth, PA (US); Eugene Joseph Karwacki, Jr., Orefield, PA (US)

(73) Assignee: Air Products and Chemicals, Inc., Allentown, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/379,466

(22) Filed: Mar. 4, 2003

(65) Prior Publication Data

US 2004/0175957 A1    Sep. 9, 2004

(51) Int. Cl.
*H01L 21/31* (2006.01)
(52) U.S. Cl. .................. 438/778; 438/780
(58) Field of Classification Search ............. 438/780, 438/795, 778; 257/40
See application file for complete search history.

(56) References Cited

U.S. PATENT DOCUMENTS

| | | | |
|---|---|---|---|
| 4,603,168 A | 7/1986 | Sasaki et al. ................. 522/18 |
| 5,609,925 A | 3/1997 | Camilletti et al. .......... 427/503 |
| 5,935,646 A | 8/1999 | Raman et al. | |
| 5,970,384 A | 10/1999 | Yamazaki et al. .......... 438/795 |
| 6,017,806 A | 1/2000 | Harvey ........................ 438/475 |
| 6,042,994 A | 3/2000 | Yang et al. .................. 430/296 |
| 6,168,980 B1 | 1/2001 | Yamazaki et al. .......... 438/162 |
| 6,231,989 B1 | 5/2001 | Chung et al. | |
| 6,284,050 B1 | 9/2001 | Shi et al. .................... 118/715 |
| 6,426,236 B1 | 7/2002 | Ishizaka et al. | |
| 6,472,076 B1 | 10/2002 | Hacker | |
| 6,846,515 B1 * | 1/2005 | Vrtis et al. ............. 427/255.29 |
| 2001/0038919 A1 | 11/2001 | Berry, III et al. ........... 428/446 |
| 2002/0102413 A1 | 8/2002 | Han et al. .................... 428/446 |
| 2002/0106500 A1 | 8/2002 | Albano et al. ............ 428/304.4 |
| 2002/0132496 A1 | 9/2002 | Ball et al. | |
| 2002/0142585 A1 | 10/2002 | Mandal ....................... 438/633 |
| 2003/0003288 A1 | 1/2003 | Nakata et al. | |
| 2003/0032300 A1 | 2/2003 | Waldfried et al. .......... 438/725 |
| 2003/0054115 A1 | 3/2003 | Albano et al. .............. 427/487 |

(Continued)

FOREIGN PATENT DOCUMENTS

EP    1 482 550    12/2004

(Continued)

OTHER PUBLICATIONS

E. G. Parada, et al., "Improvement of Silicon Oxide Film Properties by Ultraviolet Excimer Lamp Annealing," Applied Surface Science 86, pp. 294-298 (1995).

(Continued)

*Primary Examiner*—Tuan H. Nguyen
(74) *Attorney, Agent, or Firm*—Rosaleen P. Morris-Oskanian

(57) ABSTRACT

Low dielectric materials and films comprising same have been identified for improved performance when used as interlevel dielectrics in integrated circuits as well as methods for making same. In one aspect of the present invention, an organosilicate glass film is exposed to an ultraviolet light source wherein the film after exposure has an at least 10% or greater improvement in its mechanical properties (i.e., material hardness and elastic modulus) compared to the as-deposited film.

31 Claims, 5 Drawing Sheets

U.S. PATENT DOCUMENTS

| | | | |
|---|---|---|---|
| 2003/0087042 A1 | 5/2003 | Murakami et al. | |
| 2003/0157267 A1* | 8/2003 | Waldfried et al. | 427/488 |
| 2003/0162034 A1 | 8/2003 | O'Neill et al. | |
| 2003/0198742 A1 | 10/2003 | Vrtis et al. | |
| 2003/0232137 A1 | 12/2003 | Vrtis et al. | |
| 2004/0096593 A1 | 5/2004 | Lukas et al. | |
| 2004/0096672 A1 | 5/2004 | Lukas et al. | |
| 2004/0197474 A1* | 10/2004 | Vrtis et al. | 427/255.28 |
| 2005/0048795 A1 | 3/2005 | Ko et al. | |

FOREIGN PATENT DOCUMENTS

| | | |
|---|---|---|
| TW | 540118 | 3/1990 |
| WO | WO 9700535 | 1/1997 |
| WO | WO 02065534 | 8/2002 |
| WO | WO 2004/083495 | 9/2004 |
| WO | WO 2005/019303 | 3/2005 |

OTHER PUBLICATIONS

A. Guo, et al., "Highly Active Visible-Light Photocatalysts for Curing a Ceramic Precursor[1]," Chem Mater. 10, pp. 531-536 (1998).

T. Clark, Jr., et al., "A New Application of UV-Ozone Treatment in the Preparation of Substrate-Supported, Mesoporous Thin Films," Chem. Mater. 12, pp. 3879-3884 (2000).

M. Brinkmann, et al., "Room-Temperature Synthesis of a-$SiO_2$ Thin Films by UV-Assisted Ozonolysis of a Polymer Precursor," Chem. Mater. 13, pp. 967-972 (2001).

A. Hozumi, et al., "Low-Temperature Elimination of Organic Components from Mesostructured Organic-Inorganic Composite Films Using Vacuum Ultraviolet Light," Chem. Mater. 12, pp. 3842-3847 (2000).

M. Ouyang, et al., "Conversion of Some Siloxane Polymers to Silicon Oxide by UV/Ozone Photochemical Processes," Chem. Mater. 12, pp. 1591-1596 (2000).

Q. Han, et al., "Ultra Low-k Porous Silicon Dioxide Films from a Plasma Process," IEEE (2001), pp. 171-173.

C. Waldfried, et al., "Single Wafer RapidCuring™ of Porous Low-k Materials," IEEE (2002), pp. 226-228.

Dixit, Girish, et al., "Film Properties and Integration Performance of a Nano-Porous Carbon Doped Oxide", Applied Materials, Inc, Santa Clara, California, USA, International Interconnect Technology Conference, Jun. 2004.

* cited by examiner

MECHANICAL ENHANCEMENT OF DENSE AND POROUS ORGANOSILICATE MATERIALS BY UV EXPOSURE

BACKGROUND OF THE INVENTION

The present invention relates generally to the formation of dielectric films. More specifically, the invention relates to dielectric materials and films comprising same having a low dielectric constant and enhanced mechanical properties and methods for making same.

There is a continuing desire in the microelectronics industry to increase the circuit density in multilevel integrated circuit devices such as memory and logic chips to improve the operating speed and reduce power consumption. In order to continue to reduce the size of devices on integrated circuits, the requirements for preventing capacitive crosstalk between the different levels of metallization becomes increasingly important. These requirements can be summarized by the expression "RC", whereby "R" is the resistance of the conductive line and "C" is the capacitance of the insulating dielectric interlayer. Capacitance "C" is inversely proportional to line spacing and proportional to the dielectric constant (k) of the interlayer dielectric (ILD). Such low dielectric materials are desirable for use, for example, as premetal dielectric layers or interlevel dielectric layers.

A number of processes have been used for preparing low dielectric constant films. Chemical vapor deposition (CVD) and spin-on dielectric (SOD) processes are typically used to prepare thin films of insulating layers. Other hybrid processes are also known such as CVD of liquid polymer precursors and transport polymerization CVD. A wide variety of low K materials deposited by these techniques have been generally classified in categories such as purely inorganic materials, ceramic materials, silica-based materials, purely organic materials, or inorganic-organic hybrids. Likewise, a variety of processes have been used for curing these materials to decompose and/or remove volatile components and substantially crosslink the films such as heating, treating the materials with plasmas, electron beams, or UV radiation.

The industry has attempted to produce silica-based materials with lower dielectric constants by incorporating organics or other materials within the silicate lattice. Undoped silica glass ($SiO_2$), referred to herein as "USG", exhibits a dielectric constant of approximately 4.0. However, the dielectric constant of silica glass can be lowered to a value ranging from 2.7 to 3.5 by incorporating terminal groups such as fluorine or methyl into the silicate lattice. These materials are typically deposited as dense films and integrated within the IC device using process steps similar to those for forming USG films.

An alternative approach to reducing the dielectric constant of a material may be to introduce porosity, i.e., reducing the density of the material. A dielectric film when made porous may exhibit lower dielectric constants compared to a relatively denser film. Porosity has been introduced in low dielectric materials through a variety of different means. For example, porosity may be introduced by decomposing part of the film resulting in a film having pores and a lower density. Additional fabrication steps may be required for producing porous films that ultimately add both time and energy to the fabrication process. Minimizing the time and energy required for fabrication of these films is desirable; thus discovering materials that can be processed easily, or alternative processes that minimize processing time, is highly advantageous.

The dielectric constant (K) of a material generally cannot be reduced without a subsequent reduction in the mechanical properties, i.e., elastic modulus (Young's modulus), hardness, toughness, of the material. Mechanical strength is needed for subsequent processing steps such as etching, CMP ("Chemical Mechanical Planarization"), and depositing additional layers such as diffusion barriers for copper, copper metal ("Cu"), and cap layers on the product. Mechanical integrity, or stiffness, compressive, and shear strengths, may be particularly important to survive CMP. It has been found that the ability to survive CMP may be correlated with the elastic modulus of the material, along with other factors including polishing parameters such as the down force and platen speed. See, for example, Wang et al., "Advanced processing: CMP of CU/low-K and Cu/ultralow-K layers", Solid State Technology, September, 2001; Lin et al., "Low-k Dielectrics Characterization for Damascene Integration", International Interconnect Technology Conference, Burlingame, Calif., June, 2001. These mechanical properties are also important in the packaging of the final product. Because of the trade-off in mechanical properties, it may be impractical to use certain porous low dielectric compositions.

Besides mechanical properties, an additional concern in the production of a low dielectric film may be the overall thermal budget for manufacture of the IC device. The method used extensively in the literature for cross-linking a low dielectric film and/or introducing porosity into a film is thermal annealing. In the annealing step, or a curing step, the film is typically heated to decompose and/or remove volatile components and substantially cross-link the film. Unfortunately, due to thermal budget concerns, various components of IC devices such as Cu metal lines can only be subjected to processing temperatures for short time periods before their performance deteriorates due to undesirable diffusion processes. Additional heating and cooling steps also can significantly increase the overall manufacturing time for the device, thereby lowering the throughput.

An alternative to the thermal anneal or curing step is the use of ultraviolet light in combination with an oxygen-containing atmosphere to create pores within the material and lower the dielectric constant. The references, Hozumi, A. et al. "Low Temperature Elimination of Organic Components from Mesostructured Organic-inorganic Composite Films Using Vacuum Ultraviolet Light", Chem. Mater. 2000 Vol. 12, pp. 3842–47 ("Hozumi I") and Hozumi, A et al., "Micropatiterned Silica Films with Ordered Nanopores Fabricated through Photocalcination", NanoLetters 2001 1(8), pp. 395–399 ("Hozumi II"), describe removing a cetyltrimethylammonium chloride (CTAC) pore-former from a tetraethoxysilane (TEOS) film using ultraviolet ("VUV") light (172 nm) in the presence of oxygen. The reference, Ouyang, M., "Conversion of Some Siloxane Polymers to Silicon Oxide by UV/Ozone Photochemical Processes", Chem. Mater. 2000,12(6), pp.1591–96, describes using UV light ranging from 185 to 254 nm to generate ozone in situ to oxidize carbon side groups within poly(siloxane) films and form a $SiO_2$ film. The reference, Clark, T., et al., "A New Preparation of UV-Ozone Treatment in the Preparation of Substrate-Supported Mesoporous Thin Films", Chem. Mater. 2000, 12(12), pp. 3879–3884, describes using UV light with a wavelength below 245.4 nm to produce ozone and atomic oxygen to remove organic species within a TEOS film. These techniques, unfortunately, may damage the resultant film by chemically modifying the bonds that remain within the material.

U.S. Pat. No. 4,603,168 describes cross-linking an alkenyl-organopolysiloxane or organohydrosiloxane film by exposure to UV light or electron beam radiation in the presence of heat. The film further includes a dopant such as a photosensitizer like benzophenone or a platinum catalyst that is present in small concentrations to initiate and catalyze the cross-linking. Likewise, the reference Guo, et al., "Highly Active Visible-light Photocatalysts for Curing Ceramic Precursor", Chem. Mater. 1998, 10(2), pp. 531–36, describes using a platinum bis(beta-diketonate) catalyst to cross-link oligo(methylsilylene)methylene and tetravinylsinlane using UV/visible light. The presence of metal catalysts and chromophores would be unsuitable in dielectric films.

U.S. Pat. No. 6,284,500 describes using UV light in the from 230 to 350 nm wavelength range to photoinitiate cross-linking within an organic polymer film formed by CVD or an organosilsiquoxane formed by spin-on deposition and improve the adhesion and mechanical properties of the film. A thermal annealing step may be used to stabilize the cross-linked film.

U.S. Pat. Nos. 5,970,384 and 6,168,980 describe exposing a PVD or CVD deposited oxide gate layer to UV light in the presence of $N_2O$, $NH_3$, or $N_2H_4$ at temperatures between 300 and 700° C. The methods described in both the '384 and '980 patents reduce the C and H impurities within the oxide gate layer and introduce nitrogen near the boundary of the material with the silicon substrate.

Besides UV exposure, a further method to process low dielectric films without effecting the thermal budget of the manufacturing of the device may be by exposure to electron beam ("e-beam") radiation. The electron beam radiation step may be in addition to, or in lieu of, a thermal cure step. It is believed that the e-beam exposure may improve the mechanical properties of the film by removing most or all of the organic species from the film. For example, U.S. Pat. No. 6,042,994 describes a process wherein a nanoporous dielectric coated substrate is treated with a large area electron beam exposure system. The '994 patent contends based upon FTIR data that the e-beam cure has removed most of the organic species from the film. WO 97/00535 teaches a process for curing a dielectric material such as a spin-on-glass (SOG) having about 10–25% organic groups by exposure to e-beam irradiation. Using FTIR analysis, the WO 97/00535 application reports that there are no longer CH groups attached to the backbone of SOG starting compounds after curing with e-beam radiation.

Accordingly, there is a need in the art to provide improved dielectric materials having low dielectric constant and sufficient mechanical strength and a method and mixture for making same. Due to thermal budget concerns, there is an additional need for a low temperature treatment for the production low dielectric constant materials for integrated circuits.

All references cited herein are incorporated herein by reference in their entirety.

BRIEF SUMMARY OF THE INVENTION

The present invention satisfies one, if not all, of the needs of the art by providing a process for improving the mechanical properties of an organosilicate glass film. Specifically, in one aspect of the present invention, there is provided a process for improving a material hardness and elastic modulus of an organosilicate film comprising: depositing the organosilicate film onto at least a portion of a substrate via chemical vapor deposition of at least one chemical reagent comprising a structure-former precursor; and exposing the organosilicate film to an ultraviolet radiation source within a non-oxidizing atmosphere wherein the material hardness and the elastic modulus of the organosilicate film after the exposing step are higher than the material hardness and the elastic modulus of the organosilicate film before the exposing step.

In another aspect of the present invention, there is provided a chemical vapor deposition process for making an organosilicate glass film having the formula $Si_vO_wC_xH_yF_z$, where v+w+x+y+z=100%, v is from 10 to 35 atomic %, w is from 10 to 65 atomic %, x is from 5 to 30 atomic %, y is from 10 to 50 atomic %, and z is from 0 to 15 atomic % comprising: providing a substrate within a vacuum chamber; introducing at least one chemical reagent comprising a structure-former precursor selected from the group consisting of an organosilane and an organosiloxane into the vacuum chamber; applying energy to the at least one chemical reagent in the vacuum chamber to induce reaction of the at least one reagent to deposit an organosilicate film on at least a portion of the substrate; and exposing the organosilicate film to an ultraviolet light source within a non-oxidizing atmosphere wherein the material hardness and the elastic modulus of the organosilicate material after the exposing step are higher than the material hardness and the elastic modulus of the organosilicate material before the exposing step.

In yet another aspect of the present invention, there is provided a mixture for depositing an organosilicate film comprising a dielectric constant of 3.5 or below, the mixture comprising at least one structure-former precursor selected from the group consisting of an organosilane and an organosiloxane wherein the at least one structure-former precursor and/or the organosilicate film exhibits an absorbance in the 200 to 400 wavelength range.

In an additional aspect of the present invention, there is provided a mixture for depositing an organosilicate film having a dielectric constant of 2.7 or below comprising 5 to 95% of a structure-former precursor selected from the group consisting of an organosilane and an organosiloxane and 5 to 95% of a pore-former precursor wherein at least one of the precursors and/or the organosilicate film exhibits an absorbance in the 200 to 400 nm wavelength range.

In a still further aspect of the present invention, there is provided a process for preparing a porous organosilicate film having a dielectric constant of 2.7 or less comprising: forming an organosilicate film comprising a structure-former phase and a pore-former phase dispersed within the structure-former phase onto at least a portion of a substrate wherein the organosilicate film has a first dielectric constant, a first hardness, and a first material modulus; and exposing the film to at least one ultraviolet light source within a non-oxidizing atmosphere to remove at least a portion of the pore-former phase contained therein and provide the porous organosilicate film wherein the porous organosilicate film has a second dielectric constant, a second hardness, and a second material modulus and wherein the second dielectric constant is at least 5% less than the first dielectric constant, the second modulus is at least 10% greater than the first modulus, and the second hardness is at least 10% greater than that of the first hardness.

These and other aspects of the invention will become apparent from the following detailed description.

DETAILED DESCRIPTION OF THE INVENTION

Figure 1A:
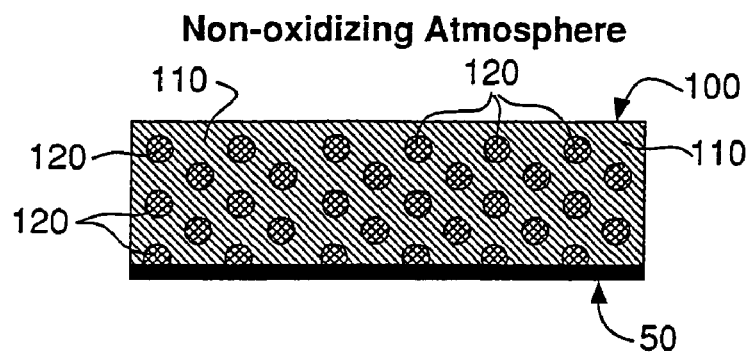
FIGS. 1a through 1c provides an illustration of the various steps of one embodiment of the present invention wherein the exposure to an UV radiation energy source results in the formation of pores within the film.

The present invention is directed towards the preparation of a dense or a porous organosilicate (OSG) glass material and film having a low dielectric constant but sufficient mechanical properties to make the film suitable for use, for example, as an interlayer dielectric in integrated circuits. The organosilicate glass film of the present invention is deposited via chemical vapor deposition of at least one structure-former precursor from the group consisting of an organosilane or an organosiloxane. The deposited organosilicate film is then exposed to an ultraviolet (UV) radiation source to improve the mechanical properties, i.e., material hardness and elastic modulus (Young's modulus) of the as-deposited film while substantially maintaining the dielectric constant of the material. In embodiments wherein the organosilicate film is deposited via chemical vapor deposition of a structure-former and a pore-former precursor to provide a porous organosilicate film, the mechanical properties of the porous organosilicate film are improved after UV exposure while the dielectric constant is reduced. Unlike other prior art processes, the UV exposure step may, in some instances, obviate the need for a thermal annealing.

While not intending to be bound by theory, it is believed that the as-deposited organosilicate films formed by chemical vapor deposition contain lattice imperfections such as, for example, dangling groups that are not incorporated into the film network. In other organosilicate films, these lattice imperfections may be hydrogen bonded to the silica framework as Si—H. In these films, the Si—H bonds are generally not broken until the material is heated to approximately 525° C., which exceeds the temperature range in which organosilicate films can typically be exposed to (i.e., 425° C. or below). Thus, thermal treatments of these films to remove Si—H may not be possible. Exposure of the organosilicate film to a UV light source, particularly combined with the application of a heat or other energy source during at least a portion of the exposure step, removes at least a portion of these dangling groups or the Si—H bonds and may "perfect" the film network. The composition of the as-deposited film and the post-UV exposed film is substantially the same. However, the mechanical properties of the UV exposed film, such as the hardness and elastic modulus, is at least 10% greater, preferably 25%, and more preferably 100% greater than the mechanical properties of the as-deposited film. Further, the dielectric constant of the UV-exposed organosilicate film is substantially the same as, or in the case of porous organosilicate films at least 5% less than, the dielectric constant of the as-deposited film. It is thus surprising and unexpected to produce low dielectric materials having enhanced mechanical properties at relatively low temperatures.

The organosilicate glass material is preferably a film that is formed onto at least a portion of a substrate. Suitable substrates that may be used include, but are not limited to, semiconductor materials such as gallium arsenide ("GaAs"), boronitride ("BN") silicon, and compositions containing silicon such as crystalline silicon, polysilicon, amorphous silicon, epitaxial silicon, silicon dioxide ("$SiO_2$"), silicon carbide ("SiC"), silicon oxycarbide ("SiOC"), silicon nitride ("SiN"), silicon carbonitride ("SiCN"), organosilicate glasses ("OSG"), organofluorosilicate glasses ("OFSG"), fluorosilicate glasses ("FSG"), and other appropriate substrates or mixtures thereof. Substrates may further comprise a variety of layers to which the film is applied thereto such as, for example, antireflective coatings, photoresists, organic polymers, porous organic and inorganic materials, metals such as copper and aluminum, or diffusion barrier layers, e.g., TiN, Ti(C)N TaN, Ta(C)N, Ta, W, WN, TiSiN, TaSiN, SICN, TiSiCN, TaSiCN, or W(C)N. The organosilicate glass films of the present invention are preferably capable of adhering to at least one of the foregoing materials sufficiently to pass a conventional pull test, such as an ASTM D3359-95a tape pull test.

The organosilicate film of the present invention may be a dense or a porous film. A dense organosilicate film has a density that may range from about 1.5 $g/cm^3$ to about 2.2 $g/cm^3$. These films are typically deposited from at least one structure-former precursor, preferably an organosilane or organosiloxane precursor.

In other embodiments of the present invention, the organosilicate film is a porous or multi-phasic film. These films are typically comprised of at least one-structure-former phase and at least one pore-former phase and are deposited by at least one structure-former precursor and at least one pore-former precursor. The at least one pore-former phase may be dispersed within the structure-former phase. The term "dispersed" as used herein includes discrete areas of pore-former phase, air-gap (i.e., relatively large areas of pore-former phase contained within a structure-former shell), or bicontinuous areas of the structure-former and the pore-former phases. While not intending to be bound by theory, it is believed that the porous organosilicate film, when exposed to one or more energy sources, adsorbs a certain amount of energy to enable the removal of at least a portion of the pore-former phase from the material while leaving the bonds within the structure-former phase intact. Depending upon the energy source and the chemistry of the pore-former phase, the chemical bonds within the pore-former phase may be broken thereby facilitating its removal from the material. In this manner, the pore-former phase may be substantially removed from the organosilicate film thereby leaving a porous film that consists essentially of the structure-former phase. The resultant porous organosilicate film, after exposure to one or more energy sources, will exhibit a lower density and lower dielectric constant than the as-deposited film.

The organosilicate glass (OSG) film of the present invention comprises a structure-former phase that is capable of forming and maintaining an interconnecting network. Examples of the organosilicate glass films and the structure-former phase contained therein include, but are not limited to, silicon carbide (SiC), hydrogenated silicon carbide (Si:C:H), silicon oxycarbide (Si:O:C), silicon oxynitride (Si:O:N), silicon carbonitride (Si:C:N), fluorosilicate glass (Si:O:F), organofluorosilicate glass (Si:O:C:H:F), organosilicate glass (Si:O:C:H), diamond-like carbon, borosilicate glass (Si:O:B:H), or phosphorous doped borosilicate glass (Si:O:B:H:P). In certain preferred embodiment, the structure-former phase comprises a silica compound. The term "silica", as used herein, is a material that has silicon (Si) and oxygen (O) atoms, and possibly additional substituents such as, but not limited to, other elements such as C, H, B, N, P, or halide atoms; alkyl groups; or aryl groups. In certain preferred embodiments, the structure-former phase may comprise an OSG compound represented by the formula $Si_vO_wC_xH_yF_z$, where v+w+x+y+z=100%, v is from 10 to 35 atomic %, w is from 10 to 65 atomic %, x is from 5 to 30 atomic %, y is from 10 to 50 atomic % and z is from 0 to 15 atomic %. Regardless of whether or not the structure-former is unchanged throughout the inventive process, the term "structure-former" as used herein is intended to encompass structure-forming reagents or precursors (or structure-forming substituents) and derivatives thereof, in whatever forms they are found throughout the entire process of the invention.

In embodiments wherein the organosilicate film is porous, the organosilicate film comprises at least one pore-former phase in addition to the structure-former phase. The pore-former phase comprises a compound(s) that is capable of being easily and preferably substantially removed from the organosilicate film upon exposure to one or more energy sources. The pore-former phase may also be referred to as a porogen. A "pore-former", as used herein, is a reagent that is used to generate void volume within the resultant film. Regardless of whether or not the pore-former is unchanged throughout the inventive process, the term "pore-former" as used herein is intended to encompass pore-forming reagents or precursors (or pore-forming substituents) and derivatives thereof, in whatever forms they are found throughout the entire process of the invention. Suitable compounds to be used as the pore-former phase of the present invention include, but are not limited to, hydrocarbon materials, labile organic groups, decomposable polymers, surfactants, dendrimers, hyper-branched polymers, polyoxyalkylene compounds, hydrocarbon compounds or combinations thereof. In certain preferred embodiments of the present invention, the pore-former phase comprises a $C_1$ to $C_{13}$ hydrocarbon compound. As mentioned previously, the organosilicate films are deposited onto at least a portion of a substrate from a precursor composition or mixture using a variety of different methods. These methods may be used by themselves or in combination. Some examples of processes that may be used to form the organosilicate film include the following: thermal chemical vapor deposition, plasma enhanced chemical vapor deposition ("PECVD"), high density PECVD, photon assisted CVD, plasma-photon assisted ("PPECVD"), cryogenic chemical vapor deposition, chemical assisted vapor deposition, hot-filament chemical vapor deposition, photo initiated chemical vapor deposition, CVD of a liquid polymer precursor, deposition from supercritical fluids, or transport polymerization ("TP"). U.S. Pat. Nos. 6,171,945, 6,054,206, 6,054,379, 6,159,871 and WO 99/41423 provide some exemplary CVD methods that may be used to form the organosilicate film of the present invention. In certain preferred embodiments, the deposition is conducted at a temperature ranging from 100 to 425° C., preferably from 250 to 425°. Although the chemical reagents used herein may be sometimes described as "gaseous", it is understood that the chemical reagents may be delivered directly as a gas to the reactor, delivered as a vaporized liquid, a sublimed solid and/or transported by an inert carrier gas into the reactor.

In preferred embodiments of the present invention, the organosilicate film is formed through a plasma-enhanced chemical vapor deposition process. Briefly in a PECVD process, chemical reagents are flowed into a reaction chamber such as a vacuum chamber and plasma energy energizes the chemical reagents thereby forming a film on at least a portion of the substrate. In these embodiments, the organosilicate film can be formed by the co-deposition, or alternatively the sequential deposition, of a gaseous mixture comprising at least one silica containing, preferably organosilicon material, that forms the structure-former phase with at least one plasma-polymerizable organic material that forms the pore-former phase. In certain embodiments, the plasma energy applied to the reagents may range from 0.02 to 7 watts/cm$^2$, more preferably 0.3 to 3 watts/cm$^2$. Flow rates for each of the reagents may ranges from 10 to 5000 sccm. Pressure values in the vacuum chamber during deposition for a PECVD process of the present invention may range from 0.01 to 600 torr, more preferably 1 to 10 torr. It is understood however that process parameters such as plasma energy, flow rate, and pressure may vary depending upon numerous factors such as the surface area of the substrate, the structure-former and pore-former phases to be formed, the equipment used in the PECVD process, etc.

In a certain preferred embodiment of the present invention wherein the organosilicate glass film consists essentially of Si, C, O, H, and optionally F, the film is formed by providing a substrate within a vacuum chamber; introducing into the vacuum chamber chemical reagents that comprise at least one structure-former precursor selected from the group consisting of an organosilane and an organosiloxane, and optionally a pore-former precursor distinct from the at least one structure-former precursor; and applying energy to the reagents in said chamber to induce reaction of the reagents and to form the film on the substrate. Examples of chemical reagents used as structure-former and pore-former precursors may be found in pending U.S. patent application Ser. Nos. 09/761,269, 10/150,798, 09/863,150, and 10/624,356, which are commonly assigned to the assignee of the present invention and incorporated herein by reference in its entirety.

Silica-containing compounds such as organosilanes and organosiloxanes are the preferred precursors to form the structure-former phase of the organosilicate glass film. Suitable organosilanes and organosiloxanes include, e.g.: (a) alkylsilanes represented by the formula $R^1{}_nSiR^2{}_{4-n}$, where n is an integer from 1 to 3; $R^1$ and $R^2$ are independently at least one branched or straight chain $C_1$ to $C_8$ alkyl group (e.g., methyl, ethyl), a $C_3$ to $C_8$ substituted or unsubstituted cycloalkyl group (e.g., cyclobutyl, cyclohexyl), a $C_3$ to $C_{10}$ partially unsaturated alkyl group (e.g., propenyl, butadienyl), a $C_6$ to $C_{12}$ substituted or unsubstituted aromatic (e.g., phenyl, tolyl), a corresponding linear, branched, cyclic, partially unsaturated alkyl, or aromatic containing alkoxy group (e.g., methoxy, ethoxy, phenoxy), and $R^2$ is alternatively hydride (e.g., methylsilane, dimethylsilane, trimethylsilane, tetramethylsilane, phenylsilane, methylphenylsilane, cyclohexylsilane, tert-butylsilane, ethylsilane, diethylsilane, tetraethoxysilane, dimethyidiethoxysilane, dimethyldimethoxysilane, dimethylethoxysilane, methyltriethoxysilane, methyldiethoxysilane, triethoxysilane, trimethylphenoxysilane and phenoxysilane); (b) a linear organosiloxane represented by the formula $R^1(R^2{}_2SiO)_nSiR^2{}_3$ where n is an integer from 1 to 10, or a cyclic organosiloxane represented by the formula $(R^1R^2SiO)_n$ where n is an integer from 2 to 10 and $R^1$ and $R^2$ are as defined above (e.g., 1,3,5,7-tetramethylcyclotetrasiloxane, octamethylcyclotetrasiloxane, hexamethylcyclotrisiloxane, hexamethyldisiloxane, 1,1,2,2-tetramethyldisiloxane, and octamethyltrisiloxane); and (c) a linear organosilane oligomer represented by the formula $R^2(SiR^1R^2)_nR^2$ where n is an integer from 2 to 10, or cyclic organosilane represented by the formula $(SiR^1R^2)_n$, where n is an integer from 3 to 10, and $R^1$ and $R^2$ are as defined above (e.g., 1,2-dimethyldisilane, 1,1,2,2-tetramethyldisilane, 1,2-dimethyl-1,1,2,2-dimethoxydisilane, hexamethyidisilane, octamethyltrisilane, 1,2,3,4,5,6-hexaphenylhexasilane, 1,2-dimethyl-1,2-diphenyldisilane and 1,2-diphenyldisilane). In certain embodiments, the organosilane/organosiloxane is a cyclic alkylsilane, a cyclic alkoxysilane or contains at least one alkoxy or alkyl bridge between a pair of Si atoms, such as 1,2-disilanoethane, 1,3-disilanopropane, dimethylsilacyclobutane, 1,2-bis(trimethylsiloxy)cyclobutene, 1,1-dimethyl-1-sila-2,6-dioxacyclohexane, 1,1-dimethyl-1-sila-2-oxacyclohexane, 1,2-bis(trimethylsiloxy)ethane, 1,4-bis(dimethylsilyl)benzene or 1,3-(dimethylsilyl)cyclobutane. In certain embodiments, the organosilane/organosiloxane contains a reactive side group selected from the group consisting of an epoxide, a carboxylate, an alkyne, a diene, phenyl ethynyl, a strained cyclic group and a $C_4$ to $C_{10}$ group which can sterically hinder or strain the organosilane/organosiloxane, such as trimethylsilylacetylene, 1-(trimethylsilyl)-1,3-butadiene, trimethylsilylcyclopentadiene, trimethylsilylacetate and di-tert-butoxydiacetoxysilane.

In certain embodiments, the at least one structure-former phase further comprises fluorine. Preferred fluorine-providing chemical reagents for a PECVD-deposited organosilicate film lack any F—C bonds (i.e., fluorine bonded to carbon), which could end up in the film. Thus, preferred fluorine-providing reagents include, e.g., $SiF_4$, $NF_3$, $F_2$, HF, $SF_6$, $ClF_3$, $BF_3$, $BrF_3$, $SF_4$, $NF_2Cl$, $FSiH_3$, $F_2SiH_2$, $F_3SiH$, organofluorosilanes and mixtures thereof, provided that the organofluorosilanes do not include any F—C bonds. Additional preferred fluorine-providing reagents include the above mentioned alkylsilanes, alkoxysilanes, linear and cyclic organosiloxanes, linear and cyclic organosilane oligomers, cyclic or bridged organosilanes, and organosilanes with reactive side groups, provided a fluorine atom is substituted for at least one of the silicon substituents, such that there is at least one Si—F bond. More specifically, suitable fluorine-providing reagents include, e.g., fluorotrimethylsilane, difluorodimethylsilane methyltrifluorosilane, flurotriethoxysilane, 1,2-difluoro-1,1,2,2,-tetramethyidisilane, or difluorodimethoxysilane.

In certain preferred embodiments, the mixture used to form the organosilicate film preferably comprises a silica source that may form the structure-former phase. A "silica source", as used herein, is a compound having silicon (Si) and oxygen (O), and possibly additional substituents such as, but not limited to, other elements such as H, B, C, P, or halide atoms; alkyl groups; or aryl groups. The term "alkyl" as used herein includes straight chain, branched, or cyclic alkyl groups, preferably containing from 1 to 24 carbon atoms, or more preferably from 1 to 13 carbon atoms. This term applies also to alkyl moieties contained in other groups such as haloalkyl, alkaryl, or aralkyl. The term "alkyl" further applies to alkyl moieties that are substituted. The term "aryl" as used herein six to twelve member carbon rings having aromatic character. The term "aryl" also applies to aryl moieties that are substituted. The silica source may include materials that have a high number of Si—O bonds, but can further include Si—O—Si bridges, Si—R—Si bridges, Si—C bonds, Si—F bonds, Si—H bonds or a portion of the material can also have C—H bonds. Other examples of a silica source may include a fluorinated silane or fluorinated siloxane such as those provided in U.S. Pat. No. 6,258,407. Another example of a silica source may include compounds that produce a Si—H bond upon removal of the pore-former phase.

Still other examples of silica sources include silsesquioxanes such as hydrogen silsesquioxanes (HSQ, $HSiO_{1.5}$) and methyl silsesquioxanes (MSQ, $RSiO_{1.5}$ where R is a methyl group). Further examples of the suitable silica sources include those described in U.S. Pat. No. 6,271,273 and EP Nos. 1,088,868; 1,123,753, and 1,127,929. In preferred embodiments, the silica source may be a compound represented by the following: $R_aSi(OR^1)_{4-a}$, wherein R represents a hydrogen atom, a fluorine atom, or a monovalent organic group; $R^1$ represents a monovalent organic group; and a is an integer of 1 or 2; $Si(OR^2)_4$, where $R^2$ represents a monovalent organic group; or $R^3{}_b(R^4O)_{3-b}Si—(R^7)_d—Si(OR^5)_{3-c}R^6{}_c$, wherein $R^3$ to $R^6$ may be the same or different and each represents a monovalent organic group; b and c may be the same or different and each is a number of 0 to 2; $R^7$ represents an oxygen atom, a phenylene group, or a group represented by —$(CH_2)_n$-, wherein n is an integer of 1 to 6; and d is 0 or 1; or combinations thereof. The term "monovalent organic group" as used herein relates to an organic group bonded to an element of interest, such as Si or O, through a single C bond, i.e., Si—C or O—C.

In embodiments wherein a porous OSG film is formed, at least one of the gaseous reagents is a pore-former precursor. The pore-former precursor is preferably deposited in the same manner as the structure-former precursor. The pore-former precursor can be deposited, for example, in a mixture with the structure-former precursor, co-deposited with the structure-former precursor, or deposited in an alternating fashion with the structure-former precursor. In subsequent process steps, the pore-former precursor is used to generate void volume within the resultant porous film upon its removal. The pore-former in the porous OSG film may or may not be in the same form as the pore-former within the mixture and/or introduced to the reaction chamber. As well, the pore-former removal process may liberate the pore-former or fragments thereof from the film. In essence, the pore-former reagent (or pore-former substituent attached to the precursor), the pore-former in the organosilicate film, and the pore-former being removed may or may not be the same species, although it is preferable that they all originate from the pore-former reagent (or pore-former substituent).

In certain embodiments of the present invention, the pore-former may be a hydrocarbon compound, preferably having from 1 to 13 carbon atoms. Examples of these compounds include, but are not limited to, alpha-terpinene, limonene, cyclohexane, 1,2,4-trimethylcyclohexane, 1,5-dimethyl-1,5-cyclooctadiene, camphene, adamantane, 1,3-butadiene, substituted dienes and decahydronaphthelene.

In certain embodiments of the present invention, the pore-former may include labile organic groups. When some labile organic groups are present in the reaction mixture, the labile organic groups may contain sufficient oxygen to convert to gaseous products during the cure step. In yet other embodiments of the present invention, a film is deposited via CVD from a mixture comprising the labile organic groups with a peroxide compound followed by thermal annealing. Some examples of compounds containing labile organic groups include the compounds disclosed in U.S. Pat. No. 6,171,945, which is incorporated herein by reference in its entirety.

The pore-former could also be a decomposable polymer. The decomposable polymer may be radiation decomposable. The term "polymer", as used herein, also encompasses the terms oligomers and/or copolymers unless expressly stated to the contrary. Radiation decomposable polymers are polymers that decompose upon exposure to radiation, e.g., ultraviolet, X-ray, electron beam, or the like. Examples of these polymers include polymers that have an architecture that provides a three-dimensional structure such as, but not limited to, block copolymers, i.e., diblock, triblock, and multiblock copolymers; star block copolymers; radial diblock copolymers; graft diblock copolymers; cografted copolymers; dendrigraft copolymers; tapered block copolymers; and combinations of these architectures. Further examples of degradable polymers are found in U.S. Pat. No. 6,204,202, which is incorporated herein by reference in its entirety.

The pore-former may be a hyper branched or dendrimeric polymer. Hyper branched and dendrimeric polymers generally have low solution and melt viscosities, high chemical reactivity due to surface functionality, and enhanced solubility even at higher molecular weights. Some non-limiting examples of suitable decomposable hyper-branched polymers and dendrimers are provided in "Comprehensive Polymer Science", $2^{nd}$ Supplement, Aggarwal, pp. 71–132 (1996) which is incorporated herein by reference in its entirety.

In certain embodiments of the present invention, a single compound may function as both the structure-former and pore-former within the porous OSG film. That is, the structure-former precursor and the pore-former precursor are not necessarily different compounds, and in certain embodiments, the pore-former is a part of (e.g., covalently bound to) the structure-former precursor. Examples of these materials may be found, for example, in pending U.S. patent applications, Attorney Docket Nos. 06150USA and 06274PUSA, that are commonly assigned to the assignee of the present invention and incorporated herein by reference in its entirety. For example, it is possible to use 1-neohexyl-1,3,5,7-tetramethyl-cyclotetrasiloxane ("neohexyl TMCTS") as a single species, whereby the TMCTS portion of the molecule forms the base OSG structure and the bulky alkyl substituent neohexyl is the pore-former species which is removed, for example, during the anneal process. Having the pore-former attached to a Si species that will network into the OSG structure may be advantageous in achieving a higher efficiency of incorporation of pore-former into the film during the deposition process. Furthermore, it may also be advantageous to have two pore-formers attached to one Si in the precursor, such as in di-neohexyl-diethoxysilane, or two Si's attached to one pore-former, such as in 1,4-bis(diethoxysilyl)cylcohexane, since the most likely bond to break in a plasma during the deposition process is the Si-Pore-former bond. In this manner, reaction of one Si-Pore-former bond in the plasma will still result in incorporation of the pore-former in the deposited film.

In certain embodiments of the materials in which a single or multiple pore-former is attached to silicon, it may be advantageous to design the pore-former in such as way that when the film is cured to form the pores, a part of the pore-former remains attached to the silicon to impart hydrophobicity to the film. Under proper conditions this would leave a terminal —$CH_3$ group to satisfy the Si, as well as provide hydrophobicity and a low dielectric constant to the film. Examples of precursors are neopentyl triethoxysilane, neopentyl diethoxy silane, and neopentyl diethoxymethylsilane.

In certain embodiments of the present invention, an additional reagent such as a reducing agent may be added to the environment during the pore-former-phase removal process. The additional reagent may be added to enhance the removal of the one or more pore-former phases from the organosilicate film.

Figure 1B:
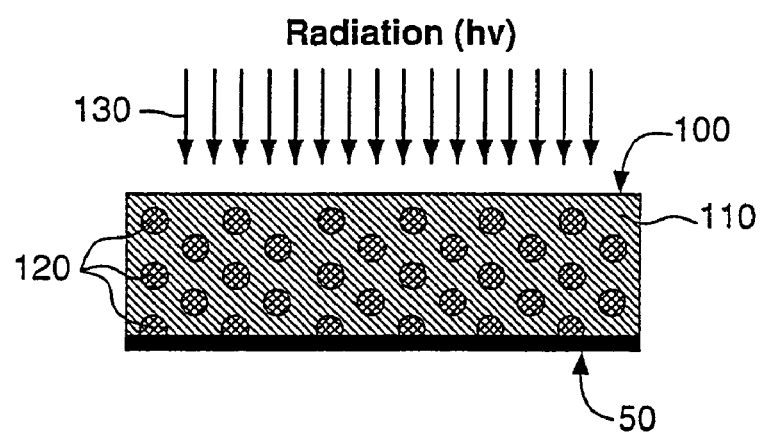
Figure 1C:
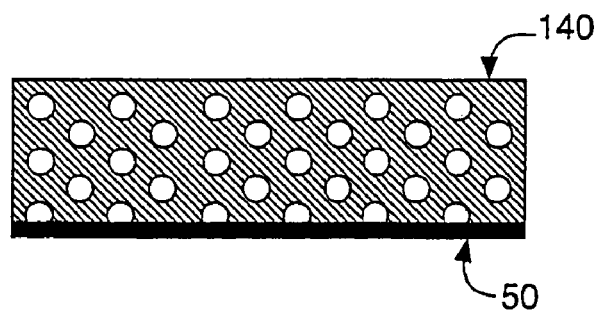

FIGS. 1a through 1c provide an illustration of one embodiment of the method of the present invention for forming a porous OSG film. Referring to FIG. 1a, a film 100 is formed upon at least a portion of a substrate 50. Film 100 comprises at least two phases: at least one structure-former phase 110 and at least one pore-former phase 120 dispersed within the structure-former phase 110. In certain preferred embodiments, the structure-former phase 110 is a compound containing primarily Si:O:C:H and the at least one pore-former phase 120 is an organic compound containing primarily C:H. In FIG. 1b, film 100 is exposed to one or more energy sources such as ultraviolet light 130. The exposure step depicted in FIG. 1b may be conducted at one or more temperatures below 425° C. and for a short time interval thereby consuming as little of the overall thermal budget of substrate 50 as possible. Referring now to FIG. 1c, the pore-former phase 120 is substantially removed from film 100 leaving a porous OSG film 140. The resultant porous film 140 will have a lower dielectric constant, at least 5% or less, and a higher material hardness and modulus, at least 10%, preferably at least 25% or greater than the dielectric constant, material hardness and modulus of the as-deposited film 100 prior to exposure.

As mentioned previously, the dense or porous OSG film is exposed to one or more ultraviolet light sources ranging from 200 to 400 nm to enhance the mechanical properties of the film. This exposure step can be in lieu of, or in addition to, an annealing step. The temperature that the substrate is subjected to during exposure to an ultraviolet light source typically ranges from between 25 to 425° C. The dielectric constant of the structure-former phase(s) remains essentially the same by the exposure to the ultraviolet light source.

The organosilicate film may be exposed to one or more wavelengths within the ultraviolet spectrum or one or more wavelengths within the ultraviolet spectrum such as deep ultraviolet light (i.e., wavelengths of 280 nm or below) or vacuum ultraviolet light (i.e., wavelengths of 200 nm or below). The ultraviolet light may be dispersive, focused, continuous wave, pulsed, or shuttered. Sources for the ultraviolet light include, but are not limited to, an excimer laser, a barrier discharge lamp, a mercury lamp, a microwave-generated UV lamp, a laser such as a frequency doubled or frequency tripled laser in the IR or visible region, or a two-photon absorption from a laser in the visible region. The ultraviolet light source may be placed at a distance that ranges from 50 milli-inches to 1,000 feet from the organosilicate film.

In certain preferred embodiments, the exposure step is conducted in a non-oxidizing atmosphere such as an inert atmosphere (e.g., nitrogen, helium, argon, xenon, krypton, radon, etc.), a reducing atmosphere (e.g., $H_2$, CO), or vacuum. It is believed that the presence of oxygen during the exposure step may substantially modify the structure forming phase(s) of the film and/or increase the dielectric constant of the film. Further, it is believed that the presence of oxygen may interfere with the removal of the pore-former precursor in embodiments where a porous OSG film is formed.

The organosilicate film may be exposed to one or more specific wavelength within the UV light source or a broad spectrum of wavelengths. For example, the film may be exposed to one or more particular wavelengths of light such as through a laser and/or optically focused light source. In the latter embodiments, the radiation source may be passed through optics such as lenses (e.g., convex, concave, cylindrical, elliptical, square or parabolic lenses), filters (e.g., RF filter), or windows (e.g., glass, plastic, fused silica, silicate, calcium fluoride, or magnesium fluoride windows) to provide specific and focused wavelengths of light. Alternatively, the radiation source does not pass through any optics.

Specific temperature and time durations for the exposure step may vary depending upon the chemical species used to form the organosilicate film. In certain preferred embodiments, the exposure step is conducted at a temperature below about 425° C., preferably below about 300° C., and more preferably below about 250° C. The exposure step is conducted for a time of about 60 minutes or less, preferably about 1 minute or less, and more preferably about 1 second or less. In certain embodiments of the present invention, the temperature of the substrate having the OSG film deposited thereupon ranges from 25 to 425° C., preferably 250 to 425° C. In these embodiments, the substrate may be placed on a heated platform, platen, or the like.

The exposure step may be conducted in a variety of settings depending upon the process used to form the organosilicate film. It may be advantageous for the exposure step to be conducted after or even during at least a portion of the organosilicate film formation step. The exposure step can be performed in various settings such as, but not limited to, quartz vessel, a modified deposition chamber, a conveyor belt process system, a hot plate, a vacuum chamber, a cluster tool, a single wafer instrument, a batch processing instrument, or a rotating turnstile.

The organosilicate film of the present invention may be further subjected to other post deposition steps such as treating the porous film with one or more energy sources. The energy source for the treating step may include, but not be limited to, an ionizing radiation source such as α-particles, β-particles, γ-rays, x-rays, high energy electron, and electron beam sources of energy; a nonionizing radiation source such as ultraviolet (10 to 400 nm), visible (400 to 750 nm), infrared (750 to $10^5$ nm), microwave (>$10^6$), and radio-frequency (>$10^6$) wavelengths of energy; thermal; plasma; or mixtures thereof. This treatment step may be performed before, during, or after the exposing step. Preferably, the treatment step may be performed prior to or during at least a portion of the exposing step. The treatment step may further increase the mechanical integrity of the material by, for example, promoting cross-linking within the porous film, stabilize the porous film, and/or remove additional chemical species from the network during at least a portion of the removal of the pore-former precursor. The one or more energy sources can include any of the energy sources disclosed herein as well as thermal sources such as a hot plate, oven, furnace, or the like.

The conditions under which the treatment step is conducted can vary greatly. For example, the treatment step can be conducted under high pressure or under a vacuum ambient. The environment can be inert (e.g., nitrogen, $CO_2$, noble gases (He, Ar, Ne, Kr, Xe), etc.), oxidizing (e.g., oxygen, air, dilute oxygen environments, enriched oxygen environments, ozone, nitrous oxide, etc.) or reducing (dilute or concentrated hydrogen, hydrocarbons (saturated, unsaturated, linear or branched, aromatics), etc.). The pressure is preferably about 1 Torr to about 1000 Torr, more preferably atmospheric pressure. However, a vacuum ambient is also possible for thermal energy sources as well as any other post-treating means. The temperature may range from 25 to 450° C., preferably from 200 to 450° C. The temperature ramp rate may range from 0.1 to 100 deg° C./min. The total treatment time may range from 0.01 min to 12 hours, preferably from 1 to 240 min.

In certain embodiments of the present invention, the OSG film may be subjected to a chemical treatment that may include, for example, the use of fluorinating (HF, $SIF_4$, $NF_3$, $F_2$, $COF_2$, $CO_2F_2$, etc.), oxidizing ($H_2O_2$, $O_3$, etc.), chemical drying, methylating, or other chemical treatments. Chemicals used in such treatments can be in solid, liquid, gaseous and/or supercritical fluid states. In certain embodiments, supercritical fluid treatment may be used to treat the film. The fluid can be carbon dioxide, water, nitrous oxide, ethylene, $SF_6$, and/or other types of chemicals. Other chemicals can be added to the supercritical fluid to enhance the process. The chemicals can be inert (e.g., nitrogen, $CO_2$, noble gases (He, Ar, Ne, Kr, Xe), etc.), oxidizing (e.g., oxygen, ozone, nitrous oxide, etc.), or reducing (e.g., dilute or concentrated hydrocarbons, hydrogen, etc.). The temperature is preferably ambient to 500° C. The chemicals can also include larger chemical species such as surfactants. The total exposure time is preferably from 0.01 min to 12 hours.

In embodiments wherein the OSG film is treated with a plasma, the plasma is conducted under the following conditions: the environment can be inert (nitrogen, $CO_2$, noble gases (He, Ar, Ne, Kr, Xe), etc.), oxidizing (e.g., oxygen, air, dilute oxygen environments, enriched oxygen environments, ozone, nitrous oxide, etc.), or reducing (e.g., dilute or concentrated hydrogen, hydrocarbons (saturated, unsaturated, linear or branched, aromatics), etc.). The plasma power is preferably 0–10 W/cm$^3$. The temperature preferably ranges from ambient to 425° C. The pressure preferably ranges from 10 mtorr to atmospheric pressure. The total treatment time is preferably 0.01 min to 12 hours.

Photocuring post-treatment may be conducted under the following conditions: the environment can be inert (e.g., nitrogen, $CO_2$, noble gases (He, Ar, Ne, Kr, Xe), etc.), or reducing (e.g., dilute or concentrated hydrocarbons, hydrogen, etc.). The temperature is preferably ambient to 425° C. The power is preferably 0–10 W/cm$^3$. The wavelength is preferably IR, visible, UV or deep UV (wavelengths<200 nm). The total curing time is preferably 0.01 min to 12 hours.

Microwave post-treatment may be conducted under the following conditions: the environment can be inert (e.g., nitrogen, $CO_2$, noble gases (He, Ar, Ne, Kr, Xe), etc.), oxidizing (e.g., oxygen, air, dilute oxygen environments, enriched oxygen environments, ozone, nitrous oxide, etc.), or reducing (e.g., dilute or concentrated hydrocarbons, hydrogen, etc.). The temperature is preferably ambient to 500° C. The power and wavelengths are varied and tunable to specific bonds. The total curing time is preferably from 0.01 min to 12 hours.

Electron beam post-treatment may be conducted under the following conditions: the environment can be vacuum, inert (e.g., nitrogen, $CO_2$, noble gases (He, Ar, Ne, Kr, Xe), etc.), oxidizing (e.g., oxygen, air, dilute oxygen environments, enriched oxygen environments, ozone, nitrous oxide, etc.), or reducing (e.g., dilute or concentrated hydrocarbons, hydrogen, etc.). The temperature is preferably ambient to 500° C. The electron density and energy can be varied and tunable to specific bonds. The total curing time is preferably from 0.001 min to 12 hours, and may be continuous or pulsed. Additional guidance regarding the general use of electron beams is available in publications such as: S. Chattopadhyay et al., Journal of Materials Science, 36 (2001) 4323–4330; G. Kloster et al., Proceedings of IITC, Jun. 3–5, 2002, SF, CA; and U.S. Pat. Nos. 6,207,555 B1 6,204,201 B1 and 6,132,814 A1.

In certain embodiments of the present invention, the organosilicate films are porous. The average pore sizes within the porous film ranges from about 1 Å to about 500 Å, preferably from about 1 Å to about 100 Å, and most preferably from about 1 Å to about 50 Å. It is preferred that the film have pores of a narrow size range and that the pores are homogeneously distributed throughout the film. However, the porosity of the film need not be homogeneous throughout the film. In certain embodiments, there is a porosity gradient and/or layers of varying porosities. Such films can be provided by, e.g., adjusting the ratio of pore-former phase to structure-former phase during formation of the porous organosilicate film. The porosity of the films may have continuous or discontinuous pores. The porous films of the invention preferably have a density of 2.0 g/ml or less, or alternatively, 1.5 g/ml or less, or 1.25 g/ml or less. Preferably, the porous films of the invention have a density at least 10% less, preferably at least 25% less, and more preferably at least 50% less than the density of the unexposed film.

The porous films of the invention have a lower dielectric constant relative to the dense OSG materials. Dense OSG films has a dielectric constant ranging from 2.7 to 3.5 whereas porous OSG films of the invention have a dielectric constant of about 2.7 or below, preferably about 2.4 or below, and more preferably about 2.2 or below.

In certain embodiments, the dense or porous OSG films of the invention are thermally stable, with good chemical resistance. In particular, the films after the UV exposure step have an average weight loss of less than 1.0 wt %/hr isothermal at 425° C. under $N_2$.

The films are suitable for a variety of uses. The films are particularly suitable for deposition on a semiconductor substrate, and are particularly suitable for use as, e.g., an insulation layer, an interlayer dielectric layer and/or an intermetal dielectric layer. The films can form a conformal coating. The properties exhibited by these films make them particularly suitable for use in Al subtractive technology and Cu damascene or dual damascene technology.

Because of their enhanced mechanical properties, the films are compatible with chemical mechanical planarization (CMP) and anisotropic etching, and are capable of adhering to a variety of substrate materials, such as silicon, $SiO_2$, $Si_3N_4$, OSG, FSG, silicon carbide, hydrogenated silicon carbide, silicon nitride, hydrogenated silicon nitride, silicon carbonitride, hydrogenated silicon carbonitride, boronitride, antireflective coatings, photoresists, organic polymers, porous organic and inorganic materials, metals such as copper and aluminum, and diffusion barrier layers such as but not limited to TiN, Ti(C)N TaN, Ta(C)N, Ta, W, or WN.

The present invention also discloses a mixture for forming a dense or a porous OSG film having a dielectric constant of 3.5 or below suitable for exposure to UV light. The OSG film may be formed by a variety of deposition processes including CVD-related and spin-on-glass processes. For dense OSG films, the mixture comprises at least one structure-former precursor and/or resultant OSG film that exhibits an absorbance in the 200 to 400 nm wavelength range. For porous OSG films, the mixture may comprise from 5% to 95% by weight of a structure-former precursor and from 5% to 95% by weight of a pore-former precursor wherein the at least one of the precursors exhibit an absorbance in the 200 to 400 nm wavelength range. Depending upon the deposition process, such as for spin-on-glass deposition, the mixture may comprise additional additives, for example, a solvent, a catalyst, a surfactant, water, and the like. Additional additives to the mixture used for spin-on-glass deposition may be found, for example, in pending U. S. patent applications Attorney Docket No. 06336PUSA, which is commonly assigned to the assignee of the present invention and incorporated herein by reference in its entirety.

Although the invention is particularly suitable for providing films and products of the invention are largely described herein as films, the invention is not limited thereto. Products of the invention can be provided in any form such as coatings, multilaminar assemblies, and other types of objects that are not necessarily planar or thin, and a multitude of objects not necessarily used in integrated circuits. Preferably, the substrate is a semiconductor.

The invention will be illustrated in more detail with reference to the following examples, but it should be understood that the present invention is not deemed to be limited thereto.

EXAMPLES

Exemplary dense and porous OSG glass films were formed via a plasma enhanced CVD process using an Applied Materials Precision-5000 system in a 200 mm DxZ vacuum chamber that was fitted with an Advanced Energy 200 rf generator from a variety of different chemical precursors and process conditions. Unless otherwise stated, the glass films were deposited onto low resistivity (R<0.02 Ω·cm) silicon wafers. The CVD process generally involved the following basic steps: initial set-up and stabilization of gas flows, deposition, and purge/evacuation of chamber prior to wafer removal. The thickness and refractive index of each film were measured by reflectometry using standard methods. The dielectric constant of each film was determined using the mercury probe capacitance technique on low resistivity p-type wafers (R<0.02 ohm-cm). Mechanical properties were determined using a MTS Nano Indenter. Transmission FTIR spectra were determined using a Thermo-Nicolet 750 Spectrophotometer at 4 cm$^{-1}$ resolution on high resistivity wafers (R>5 ohm-cm).

Thermal post-treatment or annealing was performed in an Applied Test Systems, Inc. series 3210 tube furnace fitted with 4" diameter purged quartz tube with a nitrogen purge ranging from 2 to 4 slpm. The ramp rate was 13° C. per minute from 25 to 425° C. At 425° C., the films were soaked for 240 minutes. The films were allowed to cool to below 100° C. before removal from the furnace.

UV exposure was performed using a Fusion UV model F305 ultraviolet lamp equipped with a 558434-D bulb which provides radiation ranging from 200 to 450 nm. The films subjected to UV exposure were placed in a 2" diameter quartz glass tube with end caps capable of sealing to nitrogen purge or vacuum. In examples involving a vacuum or inert atmospheres, three pump and purge cycles were performed prior to UV exposure to ensure that any oxygen concentrations within the sample tube were below 50 ppm. Films were exposed to UV radiation for between 0 and 15 minutes.

Example 1

Formation of a Dense OSG Film Using Diethoxymethylsilane (DEMS) and Triethoxysilane (TES)

An organosilicate glass film was formed onto a silicon wafer via plasma enhanced chemical vapor deposition (PECVD) of the structure-former precursors DEMS (773 mg/min) and TES (773 mg/min) using $CO_2$ as the carrier gas at a flow rate of 500 sccm. The deposition was performed at 6 torr, 600 W plasma power, and 400 milli-inch (mils) spacing between the top electrode and silicon wafer substrate. The wafer temperature during deposition was maintained at 300° C. The deposition rate of the film was 540 nm/min.

The properties of the OSG film after deposition (example 1a), after thermal anneal (example 1b), and after exposure to a UV light source (example 1c) are provided in Table I. As Table I illustrates, films 1b and 1c, which were thermally annealed and exposed to UV light respectively, exhibited a slight decrease in dielectric constant relative to example 1a or the as-deposited film. However, film 1c also exhibited a significant increase in hardness, or an approximately 23% increase in hardness, from example 1a. Example 1b, by contrast, exhibited an approximately 3% increase in hardness from example 1a. Thus, the UV exposure step provides a significant improvement in the mechanical properties of the OSG glass film relative to thermal post-treatment while using milder processing conditions.

Example 2

Formation of a Dense OSG Films Using 1,3-dimethyl-1,3-diethoxy-disiloxane(MEDS)

An organosilicate glass film was formed onto silicon wafer via PECVD of 700 mg/min of the structure-former precursor MEDS and $CO_2$ as the carrier gas at a flow rate of 250 sccm. The deposition was performed at 6 torr, 600 W plasma power, and 350 mils spacing. The wafer temperature during deposition was maintained at 250° C. The deposition rate of the film was 1330 nm/minute.

The properties (i.e., thickness, refractive index, dielectric constant, and hardness) of the OSG film after deposition (example 2a), after thermal anneal (example 2b), and after exposure to a UV light source (example 2c) are provided in Table I. As Table I illustrates, both films 2b and 2c, which were thermally annealed and exposed to UV light respectively, exhibited a slight increase in dielectric constant relative to film 2a or the as-deposited film. However, example film 2c exhibited a significant increase, or approximately 96% increase, in hardness from example 2a. Example 2b, by contrast, exhibited an approximately 14% increase in hardness from example 2a. Thus, UV exposure provides a significant improvement in the mechanical properties of the OSG glass film relative to thermal post-treatment using milder processing conditions.

Example 3

Formation of a Dense OSG Films Using Trimethylsilane (3MS)

An organosilicate glass film was formed onto silicon wafer via PECVD of 540 sccm of the structure-former precursor 3MS and a flow rate of oxygen of 90 sccm. The deposition was performed at 4 torr, 600 W plasma power, and 260 mils spacing. The wafer temperature during deposition was maintained at 350° C. The deposition rate of the film was 815 nm/minute.

The properties (i.e., thickness, refractive index, dielectric constant, and hardness) of the OSG film after deposition (example 3a) and after exposure to a UV light source (example 3b) are provided in Table I. As Table I illustrates, the exposure of film 3b to UV light lowered its dielectric constant by 0.09 or 4% and increased its hardness by 0.59 GPa or 47% relative to example 3a or the as-deposited film. Thus, UV exposure provides a significant improvement in the mechanical properties and of the OSG glass film relative to thermal post-treatment using milder processing conditions and with no negative effect on its dielectric constant.

TABLE I

Film Properties for Various Dense OSG materials

| Example | Precursor | | Thickness Loss (5%) | Refractive Index | Dielectric Constant | Hardness (GPa) |
|---------|-----------|---|---------------------|------------------|---------------------|----------------|
| 1a | DEMS/TES | As Deposited | N/A | 1.425 | 3.06 | 1.85 |
| 1b | DEMS/TES | Thermal | 0 | 1.415 | 3.03 | 1.91 |
| 1c | DEMS/TES | UV | −3 | 1.420 | 2.97 | 2.27 |

TABLE I-continued

Film Properties for Various Dense OSG materials

| Example | Precursor | | Thickness Loss (5%) | Refractive Index | Dielectric Constant | Hardness (GPa) |
|---|---|---|---|---|---|---|
| 2a | MEDS | As Deposited | N/A | 1.415 | 2.79 | 0.70 |
| 2b | MEDS | Thermal | 0 | 1.371 | 2.84 | 0.80 |
| 2c | MEDS | UV | −10 | 1.396 | 2.85 | 1.37 |
| 3a | 3MS | As Deposited | N/A | 1.445 | 3.07 | 1.25 |
| 3b | 3MS | UV | 0 | 1.439 | 2.98 | 1.84 |

Example 4

Formation of a Dense OSG Film Using Dimethyldimethoxysilane (DMDMOS)

An organosilicate glass film was formed onto a silicon wafer via PECVD of 1250 mg/min of the structure-former precursor DMDMOS with 200 sccm of a helium carrier gas and 15 sccm of $O_2$ as an additive. The deposition was performed at 12 torr, 300 W plasma power, and 300 mils spacing. The wafer temperature during deposition was maintained at 350° C. The deposition rate of the film was 110 nm/minute.

The properties of the OSG film after deposition (example 4a) and after exposure to a UV light source (example 4b) are provided in Table II. As Table II illustrates, the UV post-treatment lowered the dielectric constant of the film by 0.1 or 6%. Further, the UV post-treatment improved the modulus and hardness of the film by 5.7 GPA and 0.94 GPa, respectively, or approximately 270% and 274%, respectively.

Example 5

Formation of a Dense OSG Film Using Dimethyldimethoxysilane (DMDMOS)

An organosilicate glass film was formed onto a silicon wafer via PECVD of 750 mg/min of the structure-former precursor DMDMOS with 200 sccm of a helium carrier gas. The deposition was performed at 12 torr, 500 W plasma power, and 300 mils spacing. The wafer temperature during deposition was maintained at 350° C. The deposition rate of the film was 135 nm/minute The properties of the OSG film after deposition (example 5a) and after exposure to a UV light source (example 5b) are provided in Table II. As Table II illustrates, both the dielectric constant and hardness of the film increase upon exposure to UV light. The UV post-treatment increased the dielectric constant by 0.32 or 15% and improved the modulus and hardness of the film by approximately 207% and 170%, respectively. It is not unexpected that such dramatic improvements in the film hardness are accompanied by increases in the dielectric constant of the film. While the lack of change in the refractive index of the film suggests that the material density is not changed appreciably by UV exposure, it is believed that additional bonds such as Si—C—Si bonds that contribute positively to the film hardness may also have a negative impact on the dielectric constant.

TABLE II

Comparison of Properties of Dense DMDMOS OSG Films Before and After UV Exposure

| Example | Precursor | | Thickness Loss | Refractive Index | Dielectric Constant | Modulus (GPa) | Hardness (GPa) |
|---|---|---|---|---|---|---|---|
| 4a | DMDMOS | As Deposited | N/A | 1.387 | 2.75 | 3.36 | 0.54 |
| 4b | DMDMOS | UV | −11% | 1.351 | 2.65 | 9.06 | 1.48 |
| 5a | DMDMOS | As Deposited | N/A | 1.452 | 3.07 | 14.77 | 2.50 |
| 5b | DMDMOS | UV | −8% | 1.451 | 3.39 | 30.62 | 4.25 |

Example 6

Effect of Deposition Temperature on Dense DEMS OSG Films

Six dense OSG films were formed onto silicon wafers via PECVD using 1,500 mg/min of the structure-former DEMS, 150 sccm of helium as the carrier gas $CO_2$, and 250 sccm $CO_2$ as an additive. The deposition was performed at 6 torr, 500 W plasma power, and 300 mils spacing. The wafer temperature during deposition was varied from 150 to 425° C. A portion of the as-deposited films were thermally annealed at 425° C. for 4 hours under a nitrogen atmosphere. Other as-deposited films were exposed to UV light for 15 minutes in a vacuum atmosphere. The properties of the resultant films are provided in Table III. The relationship between hardness and dielectric for the as-deposited, thermal treated, and UV exposed DEMS OSG films at each deposition temperature is provided in FIG. 1.

TABLE III

Comparison of Deposition Temperature on Dense DEMS OSG Films

| Deposition Temperature | | Thickness Loss | Refractive Index | Dielectric Constant | Modulus (GPa) | Hardness (GPa) |
|---|---|---|---|---|---|---|
| 150° C. | As Deposited | N/A | 1.433 | 3.06 | 3.07 | 0.48 |
| 150° C. | Thermal | −4% | 1.384 | 2.79 | 5.34 | 0.94 |
| 150° C. | UV | −6% | 1.397 | 2.69 | 4.49 | 0.72 |
| 200° C. | As Deposited | N/A | 1.432 | 2.96 | 4.99 | 0.86 |
| 200° C. | Thermal | −2% | 1.402 | 2.81 | 5.33 | 0.92 |
| 200° C. | UV | −1% | 1.417 | 2.83 | 4.78 | 0.80 |
| 250° C. | As Deposited | N/A | 1.411 | 3.00 | 5.55 | 0.84 |
| 250° C. | Thermal | −1% | 1.408 | 2.90 | 7.42 | 1.30 |
| 250° C. | UV | −1% | 1.413 | 2.85 | 7.51 | 1.29 |
| 300° C. | As Deposited | N/A | 1.433 | 3.00 | 10.30 | 1.80 |
| 300° C. | Thermal | −1% | 1.430 | 3.01 | 10.90 | 1.94 |
| 300° C. | UV | −1% | 1.407 | 2.99 | 12.58 | 2.15 |
| 350° C. | As Deposited | N/A | 1.440 | 3.12 | 15.43 | 2.65 |
| 350° C. | Thermal | 0% | 1.442 | 3.09 | 15.93 | 2.68 |
| 350° C. | UV | −2% | 1.446 | 3.05 | 17.78 | 2.94 |
| 425° C. | As Deposited | N/A | 1.479 | 3.34 | 26.05 | 4.17 |
| 425° C. | Thermal | 0% | 1.479 | 3.32 | 26.61 | 4.18 |
| 425° C. | UV | −2% | 1.474 | 3.27 | 30.09 | 4.59 |

Figure 2:
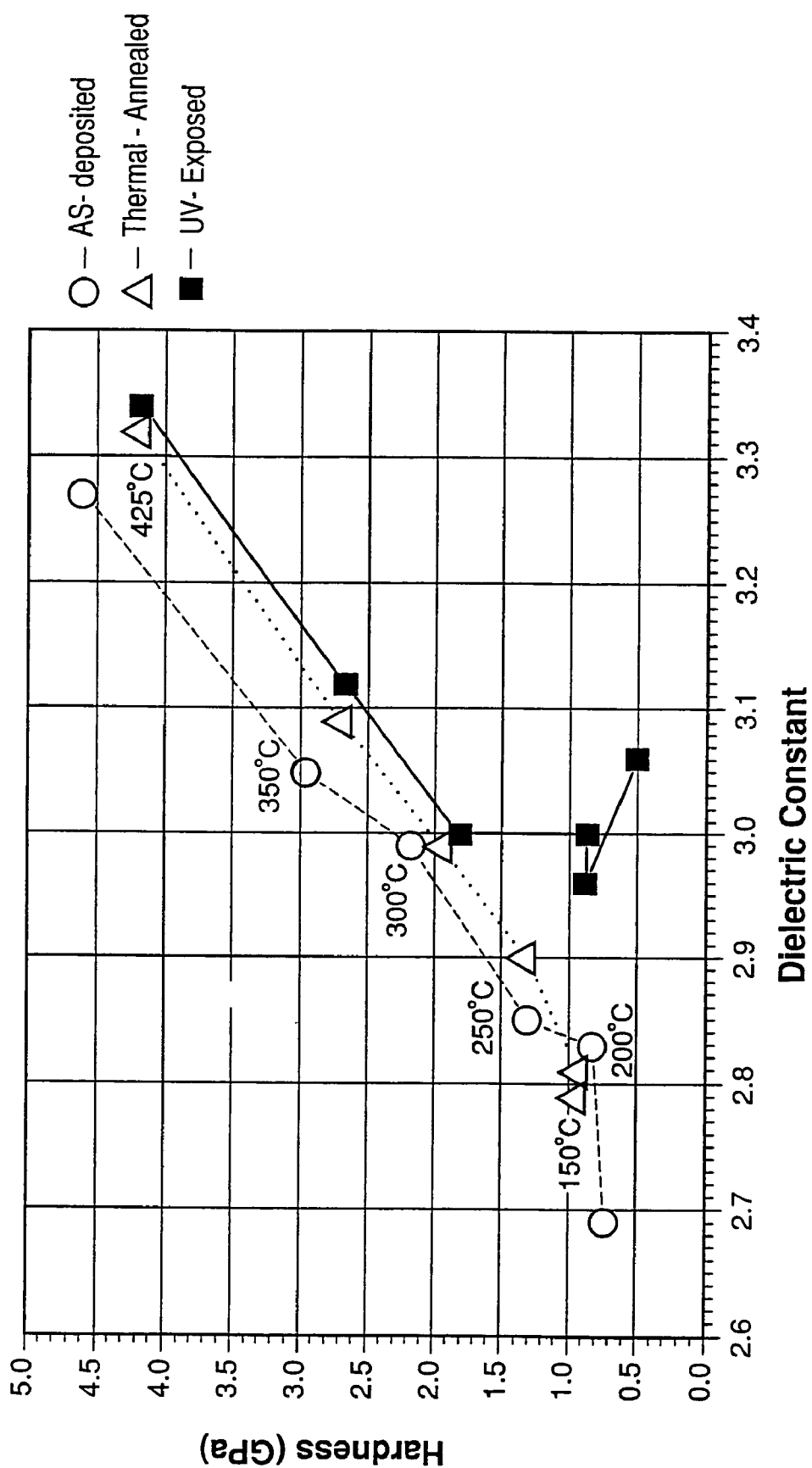
FIG. 2 compares the relationship between hardness and dielectric constant for as-deposited, thermally annealed, and UV exposed dense OSG glass films, deposited using a DEMS structure-former precursor at various processing temperatures.

Referring to Table III and FIG. 2, the deposition temperature has a significant effect on the resultant properties of the film. There is a direct relationship between the substrate temperature at which film deposition occurs and the dielectric constant and hardness of the film. The deposition temperature also influences the magnitude of the changes in film properties that can be effected by post treatment steps such as thermal annealing and UV exposure. For example, DEMS OSG films deposited at temperatures <300° C. exhibit substantial changes in dielectric constant, refractive index, and hardness upon thermal annealing. This may be due to residual alkoxy groups within the as-deposited films that are not removed during the deposition process. Both thermal anneal and UV exposure post-treatments lower the dielectric constant for DEMS OSG films deposited <300° C. The dielectric constants of the films deposited at temperatures <300° C. are generally decreased to a greater extent by UV exposure versus thermal annealing. However, the thermal anneal post-treatment is generally most effective for improving the modulus and hardness for films deposited <300° C.

Films deposited at temperatures <300° C. exhibit only small changes in either their dielectric constant or hardness after thermal annealing. This may be because thermally labile species such as alkoxy groups within the DEMS precursor chemical are removed during the deposition process when the substrate temperature is <300° C. Consequently, there is little change in either the refractive index, dielectric constant, or hardness for these films upon thermal post-treatment. However, UV exposure is still effective at increasing the mechanical strength of these films while maintaining or decreasing the dielectric constant.

FIG. 2 illustrates that there is a substantial improvement in modulus and hardness upon UV exposure for films deposited above 300° C.

Examples 7 and 8

Formation of a Dense OSG Film Using 1,3,5,7-Tetramethylcyclotetrasiloxane (TMCTS) at Various Substrate Temperatures Organosilicate glass films were formed onto a silicon wafers via PECVD of 750 mg/min of the structure-former precursor TMCTS with 500 sccm of a helium carrier gas. The depositions were performed at 6 torr, 300 W plasma power, and 320 mils spacing. The wafer temperature during deposition was maintained at 350° C. or 425° C. The deposition rate of the film was 990 nm/minute at 350° C. and 710 nm/min at 425° C.

The properties of the TMCTS OSG films after deposition (examples 7a and 8a) and after exposure to a UV light source (examples 7b and 8b) are provided in Table IV. The substrate temperature during the deposition process has a direct effect on the hardness of the TMCTS films. Additionally, a lower dielectric constant is obtained with a higher substrate temperature, indicating clearly that the overall film properties of TMCTS-based OSG materials may improve as the temperature of the substrate is raised. Comparing these same films after UV exposure (examples 7b and 8b), the dielectric constants, mechanical modulus, and hardness are nearly identical. This suggests that the UV exposure step may be modifying the chemical structure of the OSG film such that the direct relationship between dielectric constant and hardness is optimized. The degree of reorganization required is illustrated by the thickness loss of the film. When the deposition temperature is 350° C., the film loses 9% thickness upon exposure to UV light; whereas when the deposition temperature is 425° C. the film thickness decreases by only 3%.

Depending on the application, OSG films used as interlayer dielectric materials can be deposited on a variety of substrates. Because many substrates such as polymeric materials may lose their material integrity at semiconductor processing temperatures, or for thermal budget reasons, it may be advantageous to expose the OSG film to UV because the exposure can be conducted at relatively lower temperatures and the dielectric insulating characteristics are retained. The data in Table IV illustrates that an interlayer dielectric material deposited at a lower temperatures can be modified by exposure to UV radiation to dramatically improve its overall properties. This change is obtained at modest temperatures and without the addition of chemical precursors, and thus, is applicable to a wide variety of applications.

The properties of the OSG film after deposition (example 9a), after thermal anneal (example 9b), and after exposure to a UV light source (example 9c) are provided in Table V. As Table V illustrates, films 9b and 9c, which were thermally annealed and exposed to UV light respectively, exhibited a change in dielectric constant relative to example 9a. While film 9c experienced an increase in dielectric constant, it also exhibited a significant increase in modulus and hardness, or approximately 91% and 137%, respectively, from example 9a. Example 9b, by contrast, exhibited an decrease in modulus and hardness compared with example 9a. Thus, the UV exposure step provides a significant improvement in the mechanical properties of the OSG glass film relative to thermal post-treatment while using milder processing conditions.

TABLE IV

Comparison of TMCTS Dense OSG Films deposited at various temperatures before and after UV exposure (15 minutes under vacuum).

| Ex. | Precursor | Deposition Temperature | Thickness Loss (%) | Refractive Index | Dielectric Constant | Modulus (GPa) | Hardness (GPa) |
|---|---|---|---|---|---|---|---|
| 7a | TMCTS | As Dep'd 350° C. | N/A | 1.385 | 3.03 | 6.75 | 1.10 |
| 7b | TMCTS | UV " | −9 | 1.396 | 2.91 | 10.49 | 1.78 |
| 8a | TMCTS | As Dep'd 425° C. | N/A | 1.388 | 2.86 | 9.07 | 1.49 |
| 8b | TMCTS | UV " | −3 | 1.402 | 2.93 | 10.50 | 1.74 |

Examples 9 and 10

Formation of a Porous OSG Film Using 1-Neohexyl-1,3,5,7-tetramethyl-cyclotetrasiloxane (NH-TMCTS) at Varying Temperatures Organosilicate glass films were formed on silicon wafers via PECVD of 500 mg/min of the structure/pore former precursor NH-TMCTS with $CO_2$ as the carrier gas at a flow rate of 200 sccm. The deposition was performed at 8 torr, 300 W plasma power, and 300 mils spacing. The wafer temperature during deposition was maintained at either 280° C. (examples 9a, 9b, and 9c) or 350° C. (examples 10a, 10b, and 10c). The deposition rate of the film was 625 nm/minute for the films deposited at 280° C. and 420 nm/minute for films deposited at 350° C.

The properties of the OSG film after deposition (Example 10a), after thermal anneal (Example 10b), and after exposure to a UV light source (Example 10c) are provided in Table V. As Table V illustrates, films 10b and 10c, which were thermally annealed and exposed to UV light respectively, both exhibited a slight increase of 0.06 in dielectric constant relative to example 10a. However, film 10c exhibited a significant increase in modulus and hardness, or an approximately 57% and 88% increase in hardness, from example 10a. Example 10b, by contrast, exhibited an approximately 4.1% increase in modulus and approximately 7.8% increase in hardness from example 10a. Thus, the UV exposure step provides a significant improvement in the mechanical properties of the OSG glass film relative to thermal post-treatment while using milder processing conditions.

TABLE V

Comparison of NH-TMCTS Porous OSG Films deposited at various temperatures before and after UV exposure (15 minutes under vacuum).

| Example | Precursor | Dep. Temp | | Thickness Loss (%) | Refractive Index | Dielectric Constant | Modulus (GPa) | Hardness (GPa) |
|---|---|---|---|---|---|---|---|---|
| 9a | NH-TMCTS | 280° C. | As Deposited | N/A | 1.406 | 2.66 | 3.09 | 0.41 |
| 9b | NH-TMCTS | 280° C. | Thermal | −2 | 1.381 | 2.54 | 2.64 | 0.35 |
| 9c | NH-TMCTS | 280° C. | UV | −14 | 1.383 | 2.70 | 5.90 | 0.97 |
| 10a | NH-TMCTS | 350° C. | As Deposited | N/A | 1.409 | 2.63 | 4.82 | 0.64 |
| 10b | NH-TMCTS | 350° C. | Thermal | −3 | 1.400 | 2.69 | 5.02 | 0.69 |
| 10c | NH-TMCTS | 350° C. | UV | −6 | 1.399 | 2.69 | 7.55 | 1.20 |

Example 11

Formation of a Porous OSG Film Using Neohexyl-diethoxymethylsilane(NH-DEMS)

An organosilicate glass film was formed onto a silicon wafer via PECVD of 500 mg/min of the structure/pore former precursor NH-DEMS with 150 sccm of a helium carrier gas. The deposition was performed at 10 torr, 400 W plasma power, and 300 mils spacing. The wafer temperature during deposition was maintained at 250° C. The deposition rate of the film was 200 nm/minute.

The properties of the OSG film after deposition (example 11a), after thermal annealing (example 11b), and after exposure to a UV light source (example 11c) are provided in Table VI. The dielectric constant of the thermally annealed film decreases by 0.05 or 3%. Likewise, its mechanical modulus and hardness decrease by 0.62 GPa or 19% and 0.08 GPa or 18%, respectively. Conversely, exposure of the film to a UV light source raises each of the dielectric constant by 0.07 or 3%, modulus by 10.03 GPa or 305%, and the hardness by 1.97 GPa or 338%. Thus, UV exposure provides for significant enhancement of the mechanical properties of the film at milder process conditions and with only a small increase in the dielectric constant.

Example 12

Formation of a Porous OSG Film Using Neohexyl-diethoxymethylsilane(NH-DEMS)

An organosilicate glass film was formed onto a silicon wafer via PECVD of 500 mg/min of the structure/pore former precursor NH-DEMS with 150 sccm of a helium carrier gas. The deposition was performed at 8 torr, 500 W plasma power, and 400 mils spacing. The wafer temperature during deposition was maintained at 250° C. The deposition rate of the film was 240 nm/minute.

The properties of the OSG film after deposition (example 12a) and after exposure to a UV light source (example 12b) are provided in Table VI. As Table VI illustrates, the UV post-treatment improved the modulus and hardness of the film by approximately 206% and 236%, respectively, whereas the dielectric constant increased by only 6%.

Example 13

Formation of a Porous OSG Film Using Diethoxymethylsilane (DEMS), Triethoxysilane (TES), and Alpha-terpinene (ATRP)

An organosilicate glass film was formed onto a silicon wafer via PECVD of 210 mg/min of a 50/50 mixture of the structure-former precursors DEMS and TES, 490 mg/min of the pore-former ATRP, 200 sccm of $CO_2$ and 25 sccm $O_2$. The deposition was performed at 8 torr, 600 W plasma power, and 350 mils spacing. The wafer temperature during deposition was maintained at 300° C. The deposition rate of the film was 275 nm/minute.

The properties of the OSG film after deposition (example 13a), after thermal anneal (example 13b), and after exposure to a UV light source (example 13c) are provided in Table VII. As Table VII illustrates, both the thermal and UV post-treatment lowered the dielectric constant. However, the UV post-treatment lowered the dielectric constant by a greater degree, approximately 25% compared to the thermal post-treatment which lowered the dielectric constant bye approximately 12%. Further, the UV post-treatment increased the modulus and the hardness of the film by approximately 2% and approximately 10%, respectively, whereas the thermal post-treatment decreased the modulus and the hardness of the film by approximately 41% and 26% respectively. The UV exposure step clearly provides superior properties compared to the thermal post-treated films at milder conditions.

Example 14

Deposition of Porous OSG Films Using Structure-former 1,3-dimethyl-1,3-diethoxy-disiloxane (MEDS) and Pore Former alpha-terpinene (ATRP)

An organosilicate glass film was formed onto a silicon wafer via PECVD of 400 mg/min of the structure-former precursor MEDS, 600 mg/min of the pore-former precursor ATRP with 250 sccm of a $CO_2$ carrier gas. The deposition was performed at 8 torr, 600 W plasma power, and 350 mils spacing. The wafer temperature during deposition was maintained at 300° C. The deposition rate of the film was 280 nm/minute.

The properties of the OSG film after deposition (example 14a), after thermal annealing (example 14b), and after

TABLE VI

Comparison of NH-DEMS Porous OSG Films before and after UV exposure (15 minutes under vacuum).

| Example | Precursor | | Thickness Loss (%) | Refractive Index | Dielectric Constant | Modulus (GPa) | Hardness (GPa) |
|---|---|---|---|---|---|---|---|
| 11a | NH-DEMS | As Deposited | N/A | 1.437 | 2.61 | 3.29 | 0.45 |
| 11b | NH-DEMS | Thermal | −3 | 1.391 | 2.56 | 2.67 | 0.37 |
| 11c | NH-DEMS | UV | −26 | 1.385 | 2.68 | 13.32 | 1.97 |
| 12a | NH-DEMS | As Deposited | N/A | 1.436 | 2.70 | 4.88 | 0.66 |
| 12c | NH-DEMS | UV | −23 | 1.391 | 2.81 | 14.93 | 2.22 | exposure to a UV light source (example 14c) are provided in Table VII. As Table VII illustrates, the UV post-treatment increased the hardness of the film by approximately 46% compared to approximately 1% increase in the thermal annealed film. Further, the UV post-treatment step increased the modulus of the film by approximately 37% whereas the thermal annealing post-treatment step decreased the modulus by approximately 4%.

Figure 3:
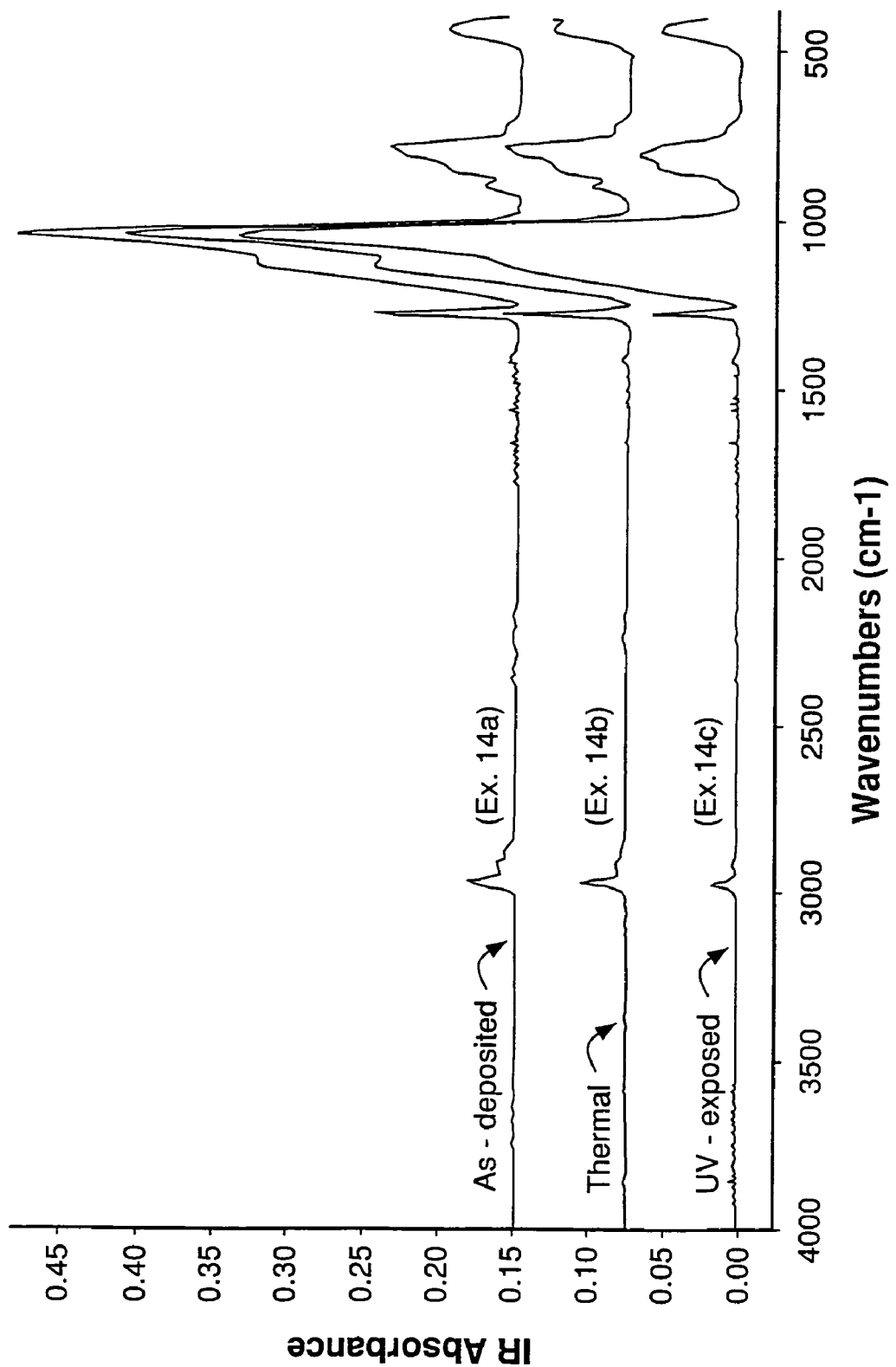
FIG. 3 provides the IR absorption spectrum for an as-deposited, thermally annealed, and UV exposed porous OSG glass film deposited using a MEDS structure-former precursor and an ATRP pore-former precursor.

FIG. 3 provides the IR absorption spectrum for each film. As FIG. 3 illustrates, at the 1160–1180 nm wavelengths, the absorbance attributed to Si—O bonding progresses from a double-peak in the as-deposited and thermally annealed films to a single peak with a slight shoulder for the UV-exposed film. This may be attributed to the effect that the UV exposure has on the network of the porous OSG film.

ATRP pore-former precursor, while the higher intensity and energy absorption likely arises from the DEMS network forming precursor.

Figure 5:
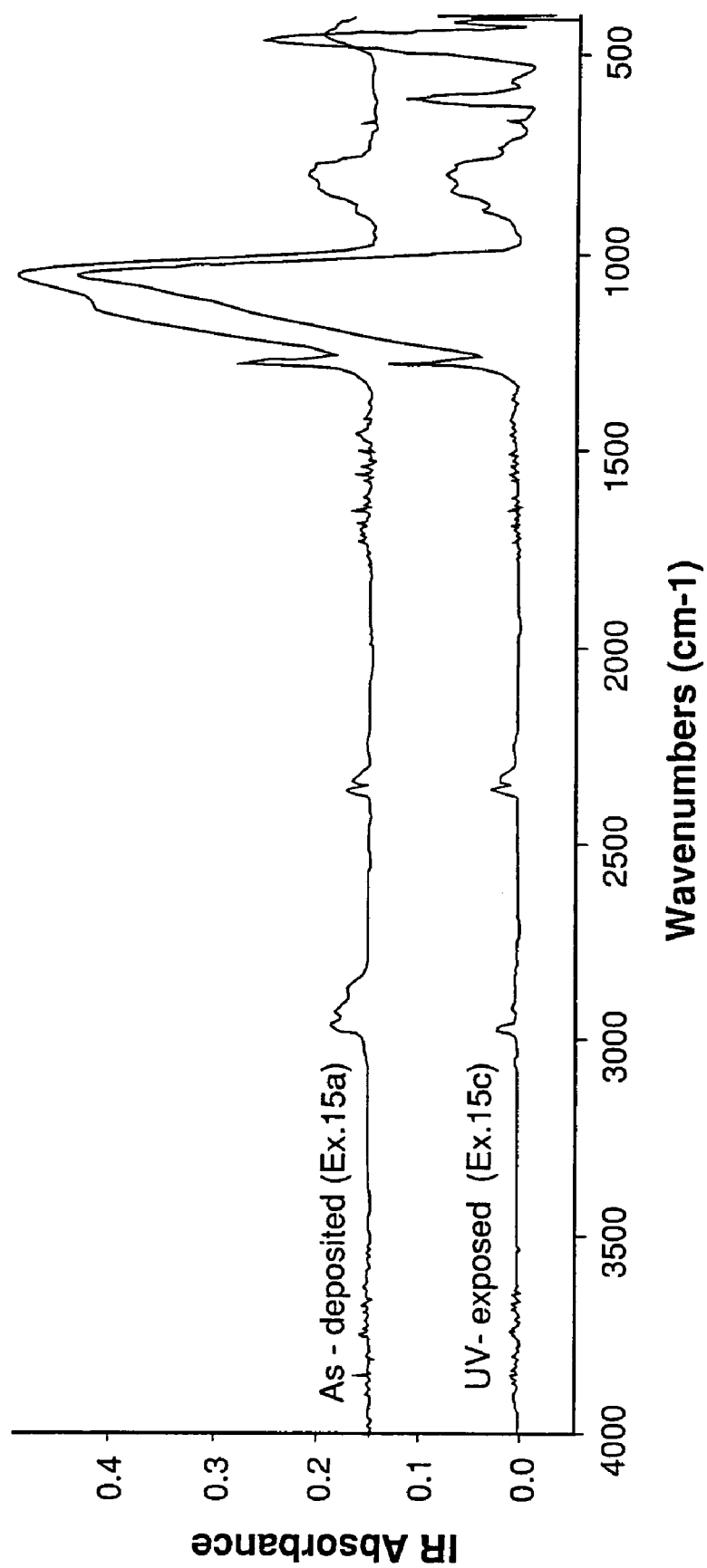
FIG. 5 provides the IR absorption spectrum for a porous OSG glass film deposited using a DEMS structure-former precursor and an ATRP pore-former precursor before and after UV exposure.

FIG. 5 provides the IR absorption spectrum of the as-deposited porous DEMS/ATRP film, Example 15a, as well as that of the film exposed to a UV light source, Example 15c. As FIG. 5 illustrates, at the 1160–1180 nm wavelengths, the absorbance attributed to Si—O bonding progresses from a double-peak in the as-deposited and thermally annealed films to a single peak with a slight shoulder for the UV-exposed film. This may be attributed to the effect that the UV exposure has reducing the Si—O bonding associated with cage-like structures and introducing a higher degree of network-like Si—O bonds that are reflected in the increased hardness.

TABLE VII

Film Properties for various Porous OSG materials

| Example | Precursor | | Thickness Loss (%) | Refractive Index | Dielectric Constant | Modulus (GPa) | Hardness (GPa) |
|---|---|---|---|---|---|---|---|
| 13a | DEMS/TES/ATRP | As Deposited | N/A | 1.482 | 3.00 | 8.17 | 1.00 |
| 13b | DEMS/TES/ATRP | Thermal | 0 | 1.351 | 2.77 | 5.79 | 0.74 |
| 13c | DEMS/TES/ATRP | UV | −8 | 1.345 | 2.51 | 8.30 | 1.10 |
| 14a | MEDS/ATRP | As Deposited | N/A | 1.421 | 2.76 | 6.62 | 1.06 |
| 14b | MEDS/ATRP | Thermal | 0 | 1.397 | 2.72 | 6.37 | 1.07 |
| 14c | MEDS/ATRP | UV | −7 | 1.386 | 2.75 | 9.08 | 1.55 |

Example 15

Deposition of Porous OSG Films Using Diethoxymethylsilane (DEMS), and Alpha-terpinene (ATRP)

An organosilicate glass film was formed onto a silicon wafer via PE-CVD of 210 mg/min of the structure-former precursor DEMS, 490 mg/min of the pore-former precursor aTRP, with 200 sccm of a $CO_2$ carrier gas and 25 sccm of an oxygen additive. The deposition was performed at 8 torr, 750 W plasma power, and 350 mils spacing. The wafer temperature during deposition was maintained at 300° C. The deposition rate of the film was 460 nm/minute.

Figure 4:
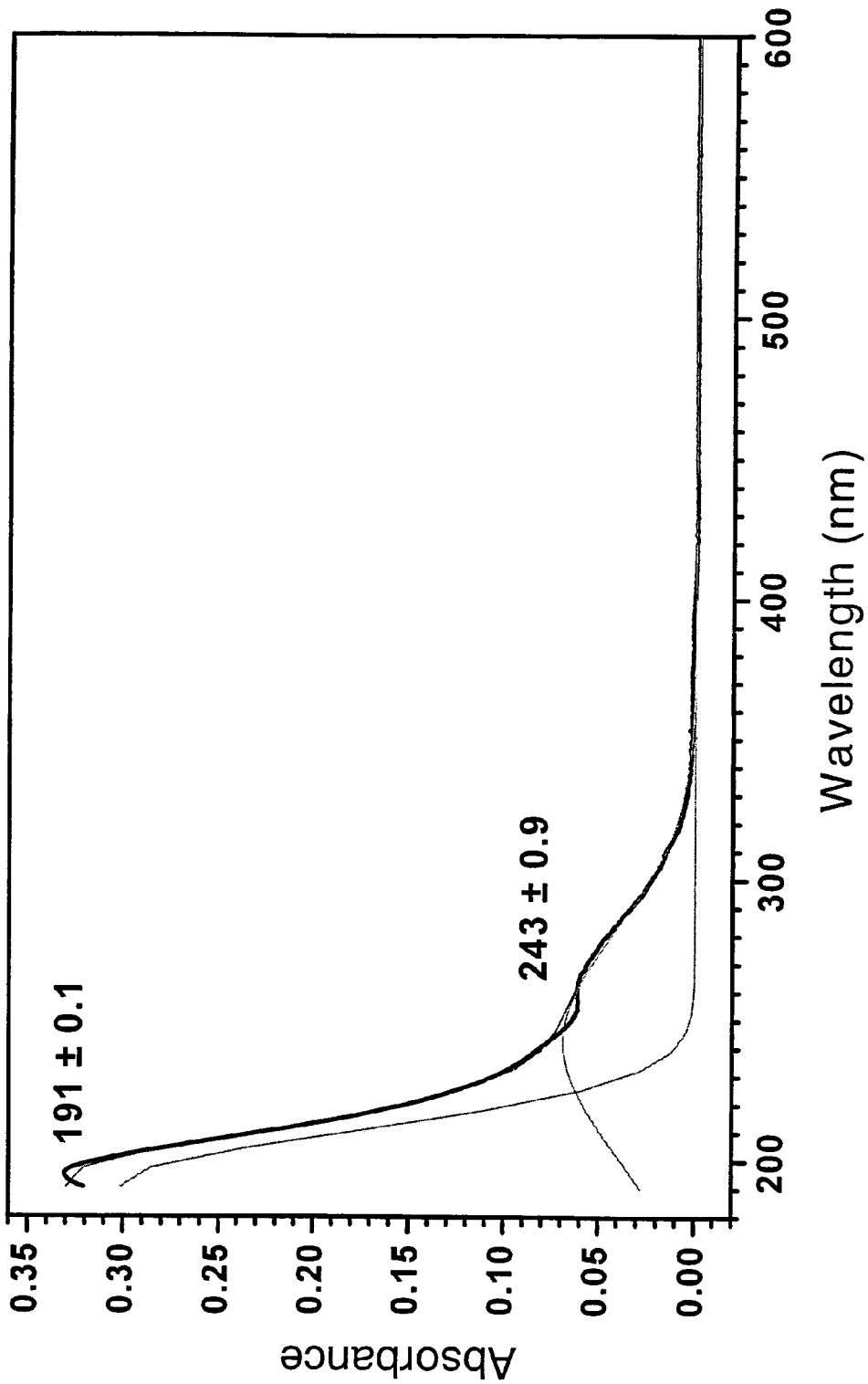
FIG. 4 provides the UVN absorption spectrum of the as-deposited porous OSG glass film deposited using a DEMS structure-former precursor and an ATRP pore-former precursor.

FIG. 4 provides the UV/visible absorption spectrum of the as-deposited porous DEMS/ATRP film. As FIG. 4 illustrates, this material has an appreciable absorption in the region of the spectrum between 190 and 280 nm. The structure of the spectrum clearly indicate two distinct maxima, the first of which is centered at approximately 268 nm, and the second at 193 nm. The lower energy absorption is likely from the

TABLE VIII

Comparison of Properties of Various Porous OSG Films Before and After UV Exposure

| Example | Precursor | | Thickness Loss | Refractive Index | Dielectric Constant | Modulus (GPa) | Hardness (GPa) |
|---|---|---|---|---|---|---|---|
| 15a | DEMS/ATRP | As Deposited | N/A | 1.482 | 2.98 | 3.74 | 0.48 |
| 15b | DEMS/ATRP | Thermal | −2% | 1.363 | 2.55 | 3.17 | 0.40 |
| 15c | DEMS/ATRP | UV | −11% | 1.345 | 2.29 | 4.73 | 0.57 |

Examples 16 and 17

Effect of Thermal Treatment Pre- and Post-UV Exposure

A porous DEMS-based OSG film was deposited by PE-CVD followed by thermal anneal at 425° C. and/or UV exposure. Precursors DEMS (210 mg/min), aTRP (490 mg/min), an oxygen additive (25 sccm), and $CO_2$ carrier gases (200 sccm) were introduced into the deposition chamber and deposited with plasma power of 600 W, spacing of 350 mils and a chamber pressure of 8 torr. The wafer temperature was 300° C. The deposition rate was 240 nm/min. The film properties of the as-deposited film (example 16a), thermal annealed film (example 16b), thermal annealed then UV exposed film (example 16c), and UV exposed film (example 16d) are provided in Table IX.

A porous DEMS-based OSG film was deposited by PE-CVD followed by thermal anneal at 425° C. and/or UV exposure. Precursors DEMS (210 mg/min), aTRP (490 mg/min), an oxygen additive (25 sccm), and $CO_2$ carrier gases (200 sccm) were introduced into the deposition chamber and deposited with plasma power of 450 W, spacing of 350 mils and a chamber pressure of 6 torr. The wafer temperature was 300° C. The deposition rate was 175 nm/min. The film properties of the as-deposited film (example 17a), thermal annealed film (example 17b), thermal annealed then UV exposed film (example 17c), UV exposed film (example 17d), and UV exposed then thermal annealed film (example 17e) are provided in Table VI.

Examples 1–15 have shown that UV exposure is superior to thermal annealing for both lowering the dielectric constant and improving the material hardness in a single post-treatment processing step for both dense and porous OSG materials. Examples 16 and 17 illustrate that thermal annealing and exposure to a UV light source can be used in sequence to improve the properties of porous OSG films to an even greater degree than UV exposure alone. In particular it should be noted that films subjected to thermal annealing alone, examples 16b and 17b, exhibited a decrease in material hardness by 9% and 11%, respectively, relative to the as-deposited films. On the other hand, the mechanical hardness of examples 16d and 17d was observed to increase by 5% and 7%, respectively, relative to the as-deposited films. Comparing examples 16b with 16d and 17b with 17d illustrates again that exposure to UV radiation is a superior method for both increasing the hardness and decreasing the dielectric constant of porous OSG films.

Examples 16c and 17c demonstrate that the use of thermal annealing and UV exposure steps in sequence can be used to enhance the material properties to an even greater degree than UV exposure alone. The results clearly show that the porous OSG material formed after thermal annealing is still susceptible to treatment by exposure to 5 UV light to enhance its materials properties. Conversely, a film exposed to UV light is stable to thermal annealing, as evidenced by the similarity between examples 1 7d and 17e.

The present invention has been set forth with regard to several preferred embodiments, but the scope of the present invention is considered to be broader than those embodiments and should be ascertained from the claims below.

The invention claimed is:

1. A process for improving a material hardness and an elastic modulus of an organosilicate film, the process comprising:
    depositing the organosilicate film onto at least a portion of a substrate via chemical vapor deposition of at least one chemical reagent comprising a structure-former precursor and a pore-former precursor: and
    exposing the organosilicate film to an ultraviolet radiation source within a non-oxidizing atmosphere wherein the material hardness and the elastic modulus of the organosilicate film after the exposing step are higher than the material hardness and the elastic modulus of the organosilicate film before the exposing step wherein the dielectric constant of the organosilicate film after the exposing step is at least 5% less than the dielectric constant of the organosilicate film before the exposing step.

2. The process of claim 1 further comprising treating the organosilicate film with a non-ionizing radiation source.

3. The process of claim 2 wherein the treating step occurs during at least a portion of the exposing step.

4. The process of claim 2 in which the non-ionizing radiation source heats the organosilicate film to a temperature between 25 to 450° C.

5. The process of claim 1 wherein the temperature of the organosilicate film during the depositing step ranges from 25 to 450° C.

6. The process of claim 5 wherein the temperature of the organosilicate film during the depositing step ranges from 250 to 450° C.

7. The process of claim 1 wherein the depositing step involves one or more processes selected from the group consisting of thermal chemical vapor deposition, plasma enhanced chemical vapor deposition, cryogenic chemical vapor deposition, chemical assisted vapor deposition, hot-filament chemical vapor deposition, photo-initiated chemical vapor deposition, or combinations thereof.

8. The process of claim 7 wherein the forming step is plasma enhanced chemical vapor deposition.

9. The process of claim 1 wherein the ultraviolet light has one or more wavelengths of about 400 nm or below.

TABLE IX

Comparison of Properties of Various Porous OSG Films Before and After UV Exposure

| Example | Precursor | | Thickness Loss (5%) | Refractive Index | Dielectric Constant | Modulus (GPa) | Hardness (GPa) |
|---|---|---|---|---|---|---|---|
| 16a | DEMS/ATRP | As Deposited | N/A | 1.458 | 2.74 | 5.87 | 0.86 |
| 16b | DEMS/ATRP | Thermal | 0 | 1.350 | 2.48 | 4.89 | 0.74 |
| 16c | DEMS/ATRP | Thermal + UV | −10 | 1.354 | 2.40 | 7.42 | 1.07 |
| 16d | DEMS/ATRP | UV | −4 | 1.338 | 2.44 | 6.64 | 0.90 |
| 17a | DEMS/ATRP | As Deposited | N/A | 1. | 2.79 | 4.89 | 1.05 |
| 17b | DEMS/ATRP | Thermal | 0 | 1.366 | 2.61 | 5.87 | 0.93 |
| 17c | DEMS/ATRP | Thermal + UV | −6 | 1.348 | 2.57 | 3.74 | 1.55 |
| 17d | DEMS/ATRP | UV | −3 | 1.339 | 2.56 | 3.17 | 1.12 |
| 17e | DEMS/ATRP | UV + Thermal | −4 | 1.331 | 2.55 | 4.73 | 1.03 |

10. The process of claim 1 wherein the ultraviolet light has one or more wavelengths of about 300 nm or below.

11. The process of claim 1 wherein the ultraviolet light has one or more wavelengths of about 200 nm or below.

12. The process of claim 1 wherein the non-oxidizing atmosphere contains at least one gas selected from the group consisting of nitrogen, hydrogen, carbon monoxide, carbon dioxide, helium, argon, neon, krypton, xenon, radon, or mixtures thereof.

13. The process of claim 1 wherein the non-oxidizing atmosphere comprises a vacuum.

14. The process of claim 13 wherein the pressure ranges from 0.05 millitorr to 500 torr.

15. The organosilicate film prepared by the process of claim 1.

16. A chemical vapor deposition method for improving a material hardness and an elastic modulus of an organosilicate film represented by the formula $Si_vO_wC_xF_z$, where $v+w+x+y+z=100\%$, v is from 10 to 35 atomic %, w is from 10 to 65 atomic %, x is from 5 to 30 atomic %, y is from 10 to 50 atomic %, and z is from 0 to 15 atomic %, the method comprising:
providing a substrate within a vacuum chamber;
introducing at least one chemical reagent comprising a structure-former precursor selected from the group consisting of an organosilane and an organosiloxane and a pore-former precursor wherein at least one of pore-former precursor and the structure-former precursor is the same compound and is at least one member selected from the group consisting of 1-neohexyl-1,3,5,7-tetramethyl-cyclotetrasiloxane, di-neohexyl-diethoxysilane, 1,4-bis(diethoxysilyl)cyclohexane, or mixtures thereof into the vacuum chamber;
applying energy to the at least one chemical reagent in the vacuum chamber to induce reaction of the at least one chemical reagent to deposit an organosilicate film on at least a portion of the substrate; and
exposing the organosilicate film to an ultraviolet light source within a non-oxidizing atmosphere wherein the material hardness and the elastic modulus of the organosilicate material after the exposing step are higher than the material hardness and the elastic modulus of the organosilicate material before the exposing step.

17. The method of claim 16 further comprising heating the organosilicate film.

18. The method of claim 16 wherein the organosilane is at least one member from the group consisting of methylsilane, dimethylsilane, trimethylsilane, tetramethylsilane, phenylsilane, methylphenylsilane, cyclohexylsilane, tert-butylsilane, ethylsilane, diethylsilane, tetraethoxysilane, dimethyldiethoxysilane, dimethyldimethoxysilane, dimethylethoxysilane, methyldiethoxysilane, triethoxysilane, methyltriethoxysilane, trimethylphenoxysilane, phenoxysilane, ditertbutylsilane, diethoxysilane, and
mixtures thereof.

19. The method of claim 16 wherein the organosiloxane is at least one member from the group consisting of 1,3,5,7-tetramethylcyclotatrasiloxane, octamethylcyclotetrasiloxane, hexamethylcyclotrisiloxane, hexamethyldisiloxane, 1,1,2,2-tetramethyldisiloxane, octamethyltrisiloxane, and mixtures thereof.

20. The method of claim 16 wherein the at least one chemical reagent further comprises a pore-former precursor that is different than the structure-former precursor.

21. The method of claim 20 wherein the pore-former precursor is at least one member from the group consisting of alpha-terpinene, limonene, cyclohexane, 1,2,4-trimethylcyclohexane, 1,5-dimethyl-1,5-cyclooctadiene, camphene, adamantane, 1,3-butadiene, substituted dienes and decahydronaphthelene.

22. The method of claim 16 wherein the substrate is heated during at least a portion of the exposing step.

23. The method of claim 16 wherein the applying step is conducted at a temperature of about 250° C. or greater.

24. The organosilicate film prepared by the method of claim 16.

25. A process for improving a material hardness and an elastic modulus of an organosilicate film having a dielectric constant, the process comprising:
depositing the organosilicate film onto at least a portion of a substrate via chemical vapor deposition of at least one chemical reagent comprising a structure-former precursor provided that the at least one chemical reagent is substantially free of a pore-former precursor; and
exposing the organosilicate film to an energy source comprising an ultraviolet radiation source wherein the material hardness and the elastic modulus of the organosilicate film after the exposing step are higher than the material hardness and the elastic modulus of the organosilicate film before the exposing step and wherein the dielectric constant of the organosilicate film after the exposing step is the substantially the same as or less than the dielectric constant of the organosilicate film before the exposing step.

26. The method of claim 25 further comprising heating the organosilicate film.

27. A process for improving a material hardness and an elastic modulus of a porous organosilicate film having a dielectric constant, the process comprising:
depositing at least one chemical reagent comprising a structure-former precursor and a pore-former precursor onto at least a portion of a substrate to provide an as-deposited film; and
exposing the as-deposited film to at least one energy source comprising an ultraviolet light source to remove at least a portion of the pore-former precursor contained therein and provide the porous organosilicate film wherein the material hardness and the elastic modulus of the porous organosilicate film after the exposing step are higher than a material hardness and an elastic modulus of the as-deposited film before the exposing step and wherein the dielectric constant of the porous organosilicate film after the exposing step is at least 5% less than a dielectric constant of the as-deposited film before the exposing step.

28. The method of claim 27 further comprising heating the porous organosilicate film.

29. The method of claim 28 wherein the heating is conducted during at least a portion of exposing.

30. The method of claim 28 wherein the heating is conducted after exposing.

31. The method of claim 28 wherein the heating is conducted before exposing.

* * * * *

UNITED STATES PATENT AND TRADEMARK OFFICE
CERTIFICATE OF CORRECTION

| | | |
|---|---|---|
| PATENT NO. | : 7,098,149 B2 | Page 1 of 1 |
| APPLICATION NO. | : 10/379466 | |
| DATED | : August 29, 2006 | |
| INVENTOR(S) | : Aaron Scott Lukas et al. | |

It is certified that error appears in the above-identified patent and that said Letters Patent is hereby corrected as shown below:

In the Claims

Column 31, line 18, delete the formula "$Si_v O_w C_x F_z$", and insert therein -- $Si_v O_w C_x H_y F_z$ --.

Signed and Sealed this

Twenty-first Day of November, 2006

JON W. DUDAS
*Director of the United States Patent and Trademark Office*